(12) United States Patent
Fitzpatrick et al.

(10) Patent No.: US 6,266,517 B1
(45) Date of Patent: Jul. 24, 2001

(54) METHOD AND APPARATUS FOR CORRECTING DISTORTION IN A TRANSMITTER

(75) Inventors: Douglas D. Fitzpatrick, Palatine; Clark D. Fischbach, West Dundee, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/475,598

(22) Filed: Dec. 30, 1999

(51) Int. Cl.$^7$ ........................................................ H04B 1/04
(52) U.S. Cl. ........................ 455/114; 455/63; 455/13.4; 455/102; 455/108; 375/296; 375/297
(58) Field of Search ..................................... 455/114, 102, 455/108, 63, 13.4; 330/149, 151; 375/254, 261, 285, 296, 297

(56) References Cited

U.S. PATENT DOCUMENTS

| | | | |
|---|---|---|---|
| 5,760,646 | 6/1998 | Belcher et al. | 330/149 |
| 5,905,760 | * 5/1999 | Schnabl et al. | 375/296 |
| 5,949,283 | * 9/1999 | Proctor et al. | 330/149 |
| 6,104,241 | * 9/1999 | Cova et al. | 330/149 |

\* cited by examiner

*Primary Examiner*—William G. Trost
*Assistant Examiner*—Marceau Milord
(74) *Attorney, Agent, or Firm*—Steven R. Santema

(57) ABSTRACT

In a transmitter (200) that includes a radio frequency (RF) power amplifier (218), a predistortion signal loop (234, 240, 209, 208), and a feedforward correction loop (242, 246, 248, 250, 252, 258, 261, 262), a method and apparatus is provided for correcting distortion introduced into the transmitter by the RF power amplifier. The predistortion signal loop determines a RF power amplifier characterization function that characterizes a relationship between a signal input into the RF power amplifier and the resulting signal output by the RF power amplifier. The predistortion signal loop also determines a predistorted input signal that is based on an input signal received from an information source and on the RF power amplifier characterization function, which predistorted input signal is input into the RF power and includes input signal modifications that are meant to compensate for the distortion introduced introduced by the RF power amplifier. Any residual distortion that is introduced by the RF power and not canceled by the predistortion signal loop is then further reduced by the feedforward correction loop.

20 Claims, 10 Drawing Sheets

METHOD AND APPARATUS FOR CORRECTING DISTORTION IN A TRANSMITTER

FIELD OF THE INVENTION

The present invention relates generally to communication devices, and in particular to a Radio Frequency amplifier portion of a communication device.

BACKGROUND OF THE INVENTION

The frequency spectrum that is shared among radio communication devices is limited. Thus the ability of a transmitter to transmit as much information as possible in an allocated frequency spectrum or channel without interfering with other communication devices in adjacent channels is of great importance. To transmit as much information as possible in the allocated channel, digital communication systems typically modulate both the amplitude and phase of a radio frequency (RF) carrier. The amplitude modulation allows more information to be encoded on the carrier in a given channel than if only the phase was modulated. However, the amplitude modulation puts additional requirements on the transmitter that would not exist if only the phase of the RF carrier was modulated.

These additional requirements are due to the inherent nonlinear effects resulting from the amplification of an amplitude modulated signal by an RF power amplifier. Due to the nonlinear characteristics of the RF power amplifier, an additional magnitude component and phase component are added to the original signal. These additional components are due to the amplitude compression characteristics (AM/AM) and the phase distortion (AM/PM) characteristics of the RF power amplifier when it is driven over a range of amplitudes. If these distortion characteristics are not compensated they will cause spreading of the spectrum into the adjacent channels and thus interfere with communication devices using adjacent channels.

A number of prior art signal processing techniques have been developed to compensate for the nonlinear characteristics of power amplifiers. Among these techniques are predistortion, adaptive predistortion, feedforward correction loops and feedback correction loops. Predistortion and adaptive predistortion seek to inject a predistorted signal into an input signal's path prior to amplification. The predistorted signal includes components equal and opposite to the distortion introduced by the power amplifier and is designed to cancel the distortion introduced to the input signal by the power amplifier. However, the application of a predistorted injection signal is limited due to the difficulty of characterizing a power amplifier and correcting for the power amplifier's characteristics with a predetermined function. Feedback and feedforward are real time correction techniques and therefore do not require characterization of the power amplifier. However, feedback correction has limited bandwidth performance due to loop stability requirements and the group delay of power amplifiers when the forward path includes multiple power amplifiers. Feedforward correction provides better bandwidth performance, but at the expense of costly error amplifiers, which may also introduce distortion into the feedforward path, and additional system expense and complexity such as carefully matched delays between the input signal forward path and the feedforward loop.

To overcome the deficiencies of the individual correction techniques, a hybrid correction technique was proposed by Belcher et al., in U.S. Pat. No. 5,760,646. Belcher uses an adaptive predistortion loop that determines and injects a predistorted signal into the input signal, and a feedforward correction loop to correct the residual non-linearities in the amplified output signal. However, the adaptive predistortion loop proposed by Belcher is a hardware implementation that generates a predistortion signal and then modulates the input signal, based on the predistortion signal, by use of a vector modulator. Belcher's adaptive predistortion loop is a feedback loop that continually feeds back the output signal and continually modulates the input signal based on the fed back output signal. This technique is expensive to implement, particularly as more coefficients are generated, requiring additional hardware, in an effort to improve the accuracy of the inverse function for the injected signal. Furthermore, the modulation of the input signal by a vector modulator introduces additional distortion and injects a variable group delay in the forward path of the input signal, which is undesireable in a system that also uses feedforward error correction. In addition, the technique proposed by Belcher performs all correction in the predistortion loop at RF. The predistortion injection technique ideally corrects distortion introduced by the RF power amplifier to the informational content of the signal that is to be transmitted. The informational content of the signal is the baseband signal that has been modulated onto an RF carrier. Precision may be lost when the baseband signal is first modulated onto an RF carrier and then the modulated RF carrier is corrected with predistortion.

Therefore a need exists for a method and apparatus for providing a predistortion signal, which method and apparatus generates a more accurate inverse function without incurring increased costs, does not introduce additional distortion or a variable delay into the input signal forward path, and is able to precisely define the desired characteristics of the signal being feed into the power amplifier.

DESCRIPTION OF A PREFERRED EMBODIMENT

Figure 1:
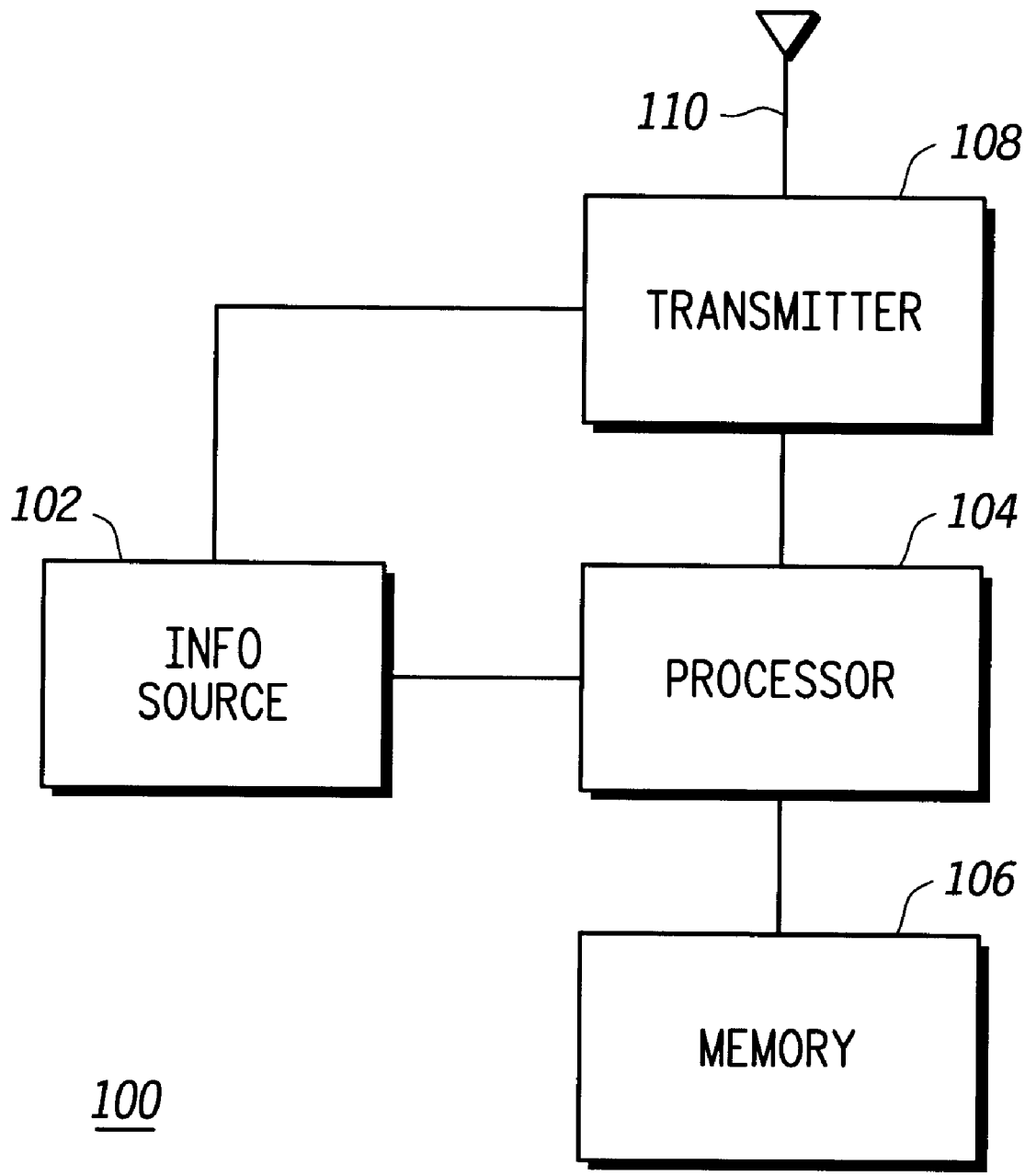
FIG. 1 is a block diagram of a communication device in accordance with a preferred embodiment of the present invention.

To address the need for a method and apparatus for providing a predistortion signal, which method and apparatus generates a more accurate inverse function without incurring increased costs, does not introduce additional distortion or a variable delay into the input signal forward path, and is able to precisely define the desired characteristics of the signal being feed into the power amplifier, a method and apparatus is provided that corrects distortion introduced into the transmitter by the RF power amplifier. A transmitter includes a radio frequency (RF) power amplifier, a predistortion signal loop, and a feedforward correction loop. The predistortion signal loop determines a RF power amplifier characterization function that characterizes a relationship between a signal input into the RF power amplifier and the resulting signal output by the RF power amplifier. The predistortion signal loop also determines a predistorted input signal that is based on an input signal received from an information source and on the RF power amplifier characterization function, which predistorted input signal is input into the RF power and includes input signal modifications that are meant to compensate for the distortion introduced introduced by the RF power amplifier. Any residual distortion that is introduced by the RF power and not canceled by the predistortion signal loop is then further reduced by the feedforward correction loop.

Generally, the present invention encompasses an apparatus for correcting distortion in a transmitter that includes a RF power amplifier that includes an input port and an output port. The RF power amplifier amplifies a predistorted input signal to produce an output signal, which output signal comprises a plurality of signal components. The apparatus includes a quadrature demodulator, a predistortion vector amplitude generator coupled to the quadrature demodulator, a vector amplitude source coupled to the predistortion vector amplitude generator, and a predistorted input signal generator coupled to the vector amplitude source. The quadrature demodulator is capable of receiving at least a portion of the output signal and demodulates the at least a portion of the output signal to produce a plurality of baseband output signal components. The predistortion vector amplitude generator receives at least a portion of the input signal wherein the at least a portion of the input signal includes a plurality of input signal components, receives at least one baseband output signal component of the plurality of baseband output signal components, and determines a RF power amplifier characterization function based on the at least one baseband output signal component and at least one input signal component of the plurality of input signal components, wherein the RF power amplifier characterization function includes a plurality of function coefficients. The vector amplitude source receives and stores the plurality of function coefficients. The predistorted input signal generator produces a predistorted input signal based on the plurality of function coefficients, wherein the predistorted input signal is capable of correcting distortion in the transmitter.

Another embodiment of the present invention encompasses a transmitter that is capable of receiving an input signal from an information source and that produces an output signal based on the received input signal. The transmitter includes a predistortion signal loop, an input quadrature modulator coupled to the predistortion signal loop, and a radio frequency power amplifier that includes an input port and an output port, wherein the input port is coupled to the input quadrature modulator and wherein the output port is coupled to the predistortion signal loop. The predistortion signal loop includes predistortion loop signal coupler, a quadrature demodulator coupled to the predistortion loop signal coupler, a predistortion vector amplitude generator coupled to the quadrature demodulator, a vector amplitude source coupled to the predistortion vector amplitude generator, and a a predistorted input signal generator coupled to the vector amplitude source. The predistortion loop signal coupler samples the output signal to produce an attenuated output signal. The quadrature demodulator receives the attenuated output signal and demodulates the attenuated output signal to produce a plurality of baseband output signal components. The predistortion vector amplitude generator receives at least a portion of the input signal wherein the at least a portion of the input signal includes a plurality of input signal components, receives at least one baseband output signal component of the plurality of baseband output signal components, and determines a RF power amplifier characterization function based on the at least one baseband output signal component and at least one input signal component of the plurality of input signal components, wherein the RF power amplifier characterization function comprises a plurality of function coefficients. The vector amplitude source receives and stores the plurality of function coefficients. The predistorted input signal generator produces a predistorted input signal based on the plurality of function coefficients, wherein the predistorted input signal is capable of correcting distortion in the transmitter. The input quadrature modulator coupled to the predistortion signal loop that modulates the predistorted input signal to a desired output signal frequency to produce a modulated predistorted input signal. The radio frequency power amplifier amplifies the modulated predistorted input signal to produce an output signal.

Finally, another embodiment of the present invention provides a method for correcting distortion in a transmitter that includes a radio frequency power amplifier, wherein distortion is introduced into the transmitter by the radio frequency power amplifier when the radio frequency power amplifier amplifies a signal input into the radio frequency power amplifier to produce an output signal. The method includes the steps of sampling the output signal to produce an attenuated output signal, receiving an input signal from an information source, wherein the input signal comprises a plurality of input signal components, and demodulating the attenuated output signal to produce a plurality of demodulated output signal components. The method further includes the steps of comparing at least one demodulated output signal component of the plurality of demodulated output signal components and at least one input signal component of the plurality of input signal components, determining a radio frequency power amplifier characterization function based on the comparison of the at least one demodulated output signal component and the at least input signal component, and determining a predistorted input signal, based on the radio frequency power amplifier characterization function, to correct the distortion in the transmitter.

Turning now to the drawings, wherein like numerals designate like components, FIG. 1 illustrates a communication device 100 in accordance with a preferred embodiment of the present invention. Preferably, communication device 100 includes a base radio such as an "iDEN" base radio available from Motorola, Inc., of Schaumburg, Ill., with additional functionality that allows the base radio to perform the functions detailed below; however, alternately, communication device 100 may include a mobile radio or a portable radio such as an "iDEN" radiotelephone, also available from Motorola, Inc., of Schaumburg, Ill. In the preferred embodiment, communication device 100 includes an information source 102, a processor 104, preferably a DSP, coupled to information source 102, a memory 106 coupled to processor 102, a transmitter 108 coupled to information source 102 and to processor 104, and an antenna 110 coupled to transmitter 108. Transmitter 108 preferably includes a transmitter capable of transmitting quadrature amplitude modulated (QAM) signals. Memory 106 preferably includes a static random access memory (SRAM), although those of ordinary skill in the art realize that other memory devices that may be written to and read from may be used here, such as dynamic random access memory (DRAM), without departing from the spirit and scope of the present invention.

Figure 2:
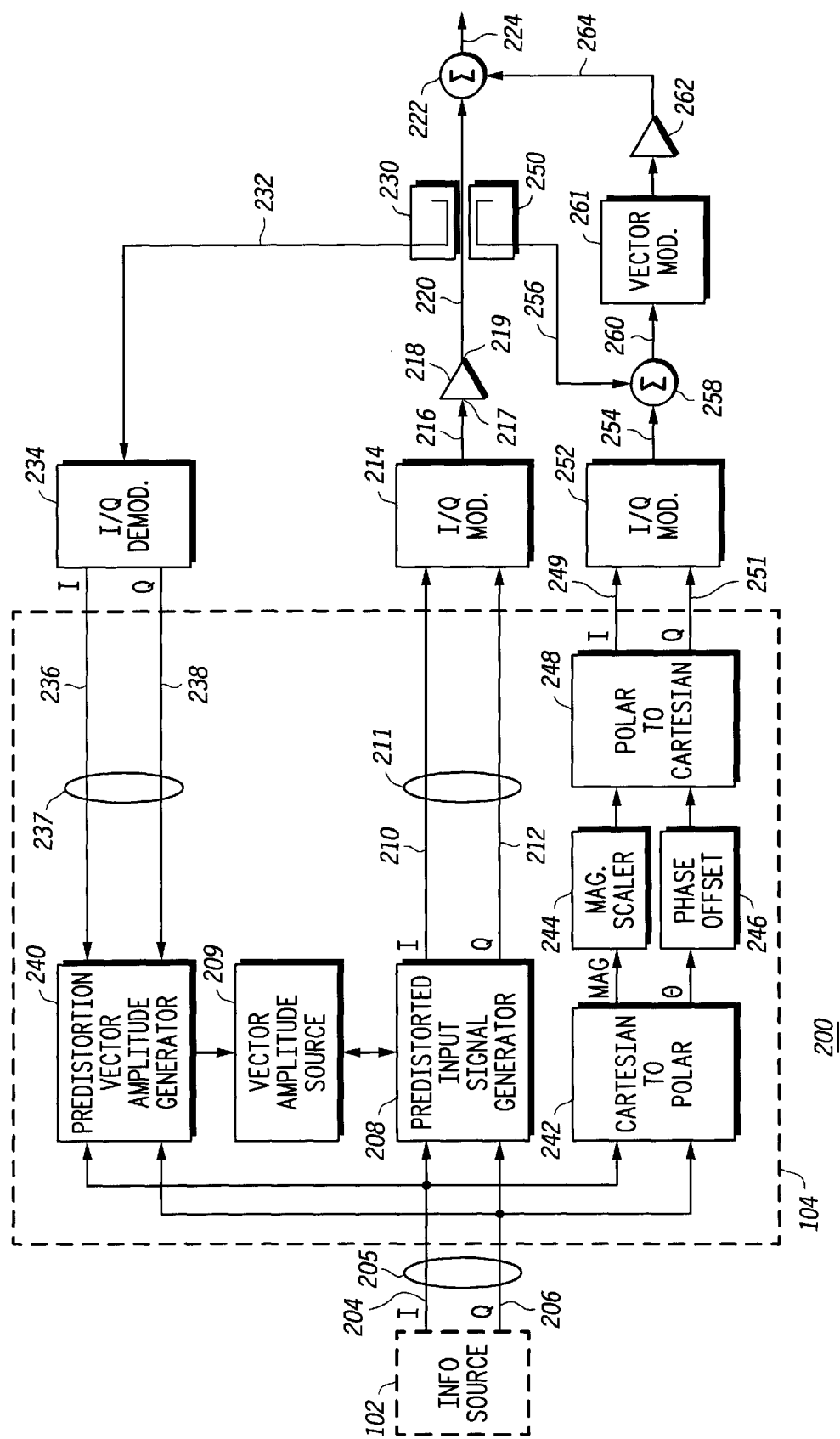
FIG. 2 is a block diagram of a transmitter in accordance with a preferred embodiment of the present invention.

FIG. 2 illustrates a transmitter 200 in accordance with a preferred embodiment of the present invention. Transmitter 200 preferably includes a radio frequency (RF) power amplifier 218 that includes an input port 217 and an output port 219, an input quadrature modulator 214 coupled to input port 217, and an output signal comparator 222, preferably a subtractor, coupled to output port 219. Preferably, RF power amplifier 21 8 includes an RF amplifying element such as a power transistor, input and output matching networks, and biasing and decoupling circuitry as are necessary to allow the functionality of the RF amplifying element and to bias the RF amplifying element class AB; however, in the alternative, those of ordinary skill in the art will realize that other biases, such as classes B or C, might be used here without departing from the spirit and scope of the present invention. Transmitter 200 preferably further includes a predistortion signal loop coupled to output port 219 of RF power amplifier 218 and to input quadrature modulator 214, and a feedforward correction loop coupled to output port 219 of RF power amplifier 218 and to output signal comparator 222.

The predistortion signal loop preferably includes a predistortion loop signal coupler 230 coupled to a quadrature demodulator 234, a predistorted vector amplitude generator (PVAG) 240 coupled to quadrature demodulator 234, a vector amplitude source 209 coupled to PVAG 240, and a predistorted input signal generator (PISG) 208 coupled to vector amplitude source 209. In the preferred embodiment, PVAG 240 and PISG 208 are each embodied in DSP 104 and the functions of PVAG 240 and PISG 208 are preformed by the execution, by DSP 104, of algorithms stored in memory 106 or in a memory associated with DSP 104. Also, in the preferred embodiment, vector amplitude source 209 is a database that is contained either in memory 106 or in a memory associated with DSP 104, which database includes initialized coefficient values based either on factory testing of the transmitter or on a selection of predetermined values by a transmitter designer.

In the preferred embodiment, the feedforward correction loop includes a feedforward loop cartesian-to-polar converter 242 coupled to a magnitude scaler 244 and to a phase offset 246, a feedforward loop polar-to-cartesian converter 248 also coupled to magnitude scaler 244 and to phase offset 246, a feedforward loop quadrature modulator 252 coupled to polar-to-cartesian converter 248, a feedforward loop combiner 258, preferably a summation junction with a 180° phase shift, coupled to quadrature modulator 252 and to a feedforward loop signal coupler 250, a vector modulator 261 coupled to combiner 258, and an error amplifier 262 coupled to vector modulator 261 and to output signal comparator 222. Vector modulator 261 preferably includes a splitter coupled to each of two variable attenuators, a phase shifting circuit coupled to one of the two attenuators that provides a 90° phase shift, and a combiner coupled to the other of the two attenuators and to the phase shifting circuit.

In the preferred embodiment, cartesian-to-polar converter 242, magnitude scaler 244, phase offset 246, and polar-to-cartesian converter 248 are each embodied in DSP 104 and their functions are preformed by the execution, by DSP 104, of algorithms stored in memory 106 or in a memory associated with DSP 104. Algorithms for converting from a cartesian representation of a signal to a polar representation of the signal, or from a polar representation of a signal to a cartesian representation of the signal, are well known in the art and will not be described in detail herein. In the preferred embodiment as described below, the conversion algorithms are stored in memory 106 or in a memory associated with DSP 104 and are executed by DSP 104 whenever a cartesian-to-polar converter or a polar-to-cartesian converter calls requires the execution of such an algorithm.

Figure 9:
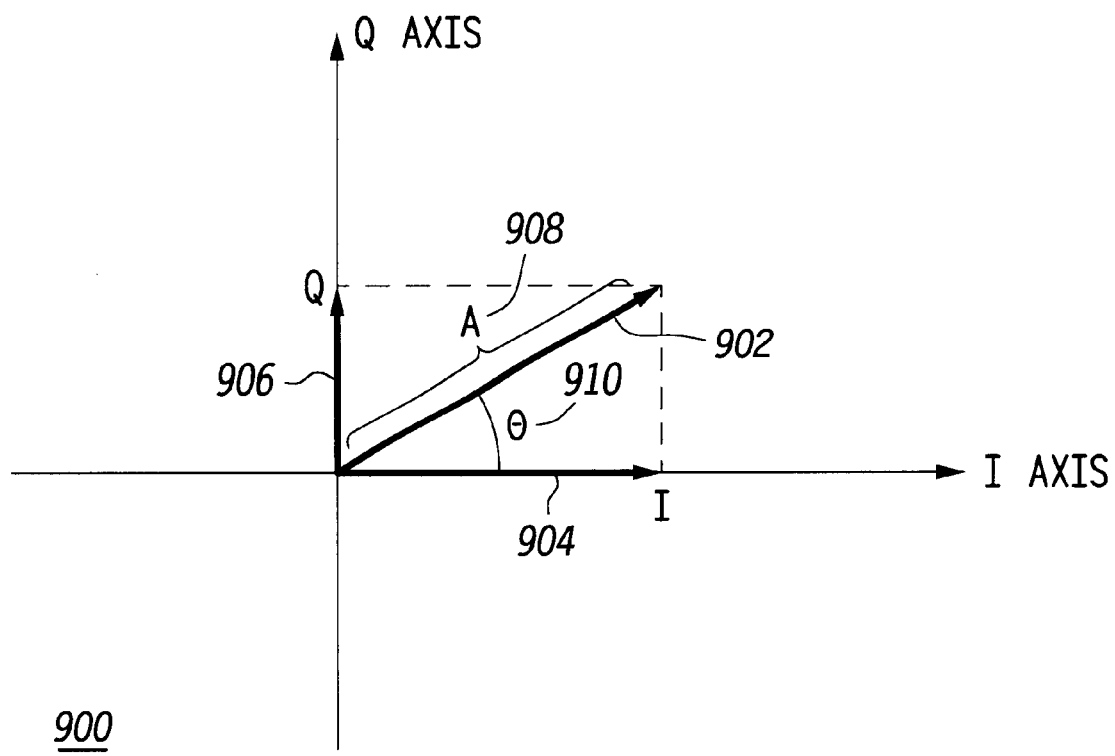
FIG. 9 is graphical illustration of a vector representation of a signal, a cartesian representation of the signal, and a polar representation of the signal in a complex two dimensional plane.

The operation of transmitter 200 is as follows in accordance with the preferred embodiment. Information source 102 generates a baseband digital input signal 205, preferably a quadrature amplitude modulation signal. Input signal 205 includes an in-phase (I) component 204 and a quadrature (Q) component 206 (which in-phase component 204 and quadrature component 206 represent a cartesian representation of input signal 205). It can be appreciated by those of ordinary skill in the art that a signal may be represented in a multiplicity of formats, and that two of the formats are a cartesian format and a polar format. FIG. 9 is an illustration of a cartesian representation of a signal and a polar representation of the signal in a complex plane 900. In complex plane 900, the signal is represented by a vector 902. When representing the signal in a cartesian format, vector 902 is represented by an in-phase (I) component 904 and a quadrature (Q) component 906. When representing the signal in a polar format, vector 902 is represented by an amplitude component 'A' 908 and a phase component 'θ' 910. The two different formats are simply two different methods of representing the same signal, or vector.

Input signal 205 is sourced by information source 102 to PISG 208 and to the feedforward correction loop. PISG 208 receives input signal 205 and, through the operation of predistortion signal loop as described in greater detail below, generates a baseband digital predistorted input signal 211, preferably a quadrature modulation signal that includes an in-phase (I) component 210 and a quadrature (Q) component 212. Predistorted input signal 211 preferably includes the information contained in input signal 205 and further includes modifications that are designed to cancel out distortion introduced by RF power amplifier 218.

Predistorted input signal 211 is conveyed by PISG 208 to input quadrature modulator 214. Input quadrature modulator 214 upconverts, preferably to a desired frequency of output signal 220, and combines in-phase component 210 and quadrature component 212 of predistorted input signal 211 to produce a modulated predistorted input signal 216. Modulated predistorted input signal 216 is then conveyed to RF power amplifier 218.

Figure 3:
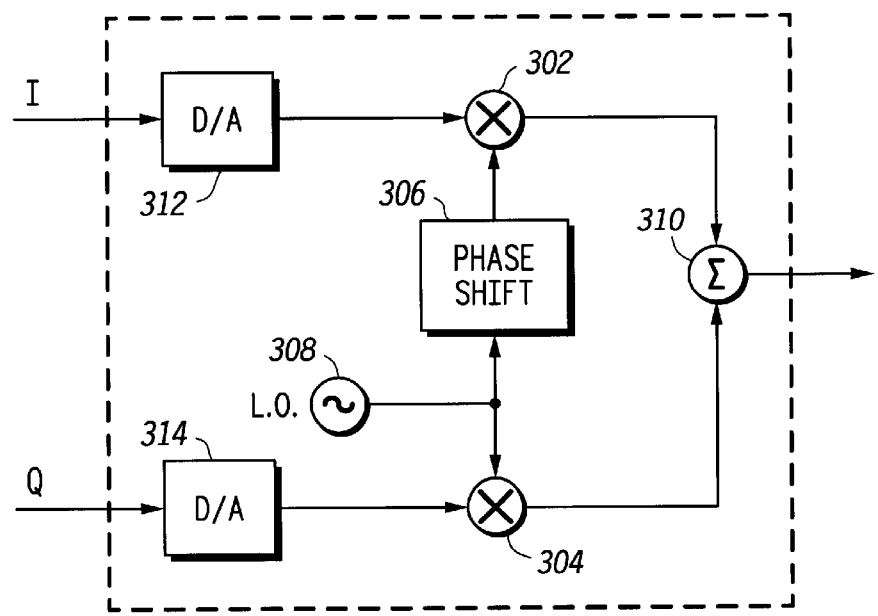
FIG. 3 is a block diagram of a quadrature modulator of FIG. 2 in accordance with a preferred embodiment of the present invention.

In the preferred embodiment of quadrature modulator 214 as described in FIG. 3, quadrature modulator 214 includes a modulator phase-shifting circuit 306 coupled to a first modulator mixer 302 and to a second modulator mixer 304, a modulator local oscillator circuit 308 coupled to first phase-shifting circuit 306 and to second modulator mixer 304, and a modulator combiner 310 coupled to first modulator mixer 302 and second modulator mixer 304. Quadrature modulator 214 preferably further includes a first digital-to-analog converter (D/A) 312 coupled to first modulator mixer 302 and a second D/A 314 coupled to second modulator mixer 304.

In quadrature modulator 214, first D/A 312 receives in-phase component 210 of predistorted input signal 211 and converts in-phase component 210 to an analog in-phase component that is conveyed to first modulator mixer 302. Second D/A 314 receives quadrature component 312 of predistorted input signal 211 and converts quadrature component 212 to an analog quadrature component that is conveyed to second modulator mixer 304. Each modulator mixer 302, 304, in addition to respectively receiving the analog in-phase and quadrature components, also receives a reference signal generated by local oscillator 308. First modulator mixer 302 receives the reference signal via modulator phase-shifting circuit 306, which phase-shifting circuit 306 introduces an approximately 90° phase delay to the reference signal. The frequency of the reference signal is the desired frequency of output signal 220. Preferably, phase-shifting circuit 306 includes a quarter-wavelength transmission line at the frequency of interest; however, those of ordinary skill in the art will realize that there are many other ways to design phase-shifting circuits without departing from the spirit and scope of the present invention and that phase-shifting circuits are often designed into integrated circuits (IC's), such as a quadrature modulator IC, using active circuitry.

In an alternate embodiment of the present invention, input quadrature modulator 214, as well as feedforward loop quadrature modulator 252 as preferably described below, may include a direct digital synthesizer (DDS) coupled to a mixer, which DDS receives two baseband signal components, synthesizes an output signal at an intermediate frequency (IF) based upon the received signal components, and conveys the synthesized output signal to the mixer. The mixer mixes the output signal with a reference signal to produce a modulated signal at the desired frequency. DDS's are well known in the art and will not be described in detail.

First modulation mixer 302 multiplies the analog in-phase component of predistorted input signal 211 with the phase delayed reference signal to produce an upconverted analog in-phase component. Second modulation mixer 304 multiplies the analog quadrature component of predistorted input signal 211 with the reference signal to produce an upconverted analog quadrature component. The upconverted analog quadrature and in-phase components of predistorted input signal 211 are then conveyed to combiner 310. Combiner 310, preferably a quadrature combiner, combines the two components to produce a modulated predistorted input signal 216.

Modulated predistorted input signal 216 is conveyed by input quadrature modulator 214 to RF power amplifier 218. RF power amplifier 218 amplifies modulated predistorted input signal 216 to produce output signal 220. The distortion introduced by RF power amplifier 218 is cancelled out by the modifications to input signal 205 that are included in predistorted input signal 211, with the result that output signal 220 is a very accurate upconverted analog replica of input signal 205. Output signal 220 is conveyed to output signal comparator 222, where residual distortion that is introduced by RF power amplifier 218 and not cancelled by upconverted predistorted input signal 216 is cancelled by the feedforward correction path as described below to produce a highly linear signal for transmission 224.

In general, the present invention provides a predistortion signal loop that produces a predistorted input signal for input into an RF power amplifier. The predistorted input signal is based on an input signal received from an information source and includes modifications to the input signal that are meant to compensate for and cancel out the distortion introduced by the RF power amplifier to signals input into the RF power amplifier. The predistortion signal loop produces the predistorted input signal at baseband and then the predistorted input signal is upconverted to a desired frequency. The upconverted predistorted input signal produced by the predistortion signal loop is then input into the RF power amplifier. Any residual distortion that is introduced by the RF power amplifier and not cancelled by the predistortion signal loop is then further reduced by the feedforward correction loop.

Figure 4:
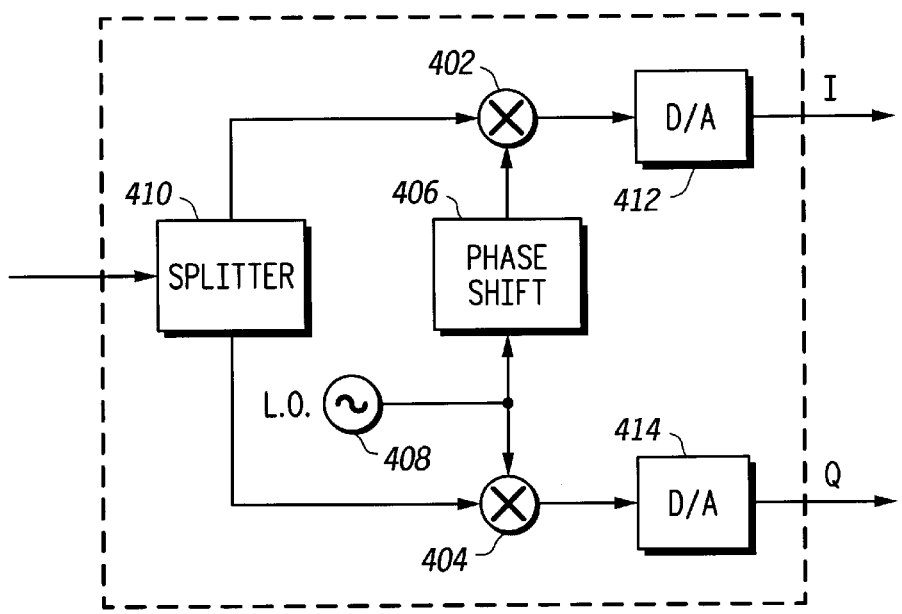
FIG. 4 is a block diagram of a quadrature demodulator of FIG. 2 in accordance with a preferred embodiment of the present invention.

The operation of the predistortion signal loop and PISG 208 are as follows in accordance with the preferred embodiment. Predistortion loop signal coupler 230 is coupled to output port 219 of RF power amplifier 218. Signal coupler 230, preferably a directional coupler, samples a portion of output signal 220 to produce an attenuated output signal 232, which attenuated output signal 232 is conveyed to quadrature demodulator 234. As shown in FIG. 4, quadrature demodulator 234 preferably includes a first demodulator mixer 402 and a second demodulator mixer 404, wherein each mixer 402, 404 is coupled to a demodulator phase-shifting circuit 406 and to a signal splitter 410. Quadrature demodulator 234 preferably further includes a demodulator local oscillator circuit 408 that is coupled to phase-shifting circuit 406 and to second demodulator mixer 404. Local oscillator circuit 408 preferably generates a reference signal at the frequency of attenuated output signal 232. Quadrature demodulator 234 preferably further includes a first analog-to-digital converter (A/D) 412 that is coupled to first demodulator mixer 402 and a second A/D 414 that is coupled to second demodulator mixer 404. Preferably, phase-shifting circuit 406 includes a quarter-wavelength transmission line at the frequency of interest; however, those of ordinary skill in the art will realize that there are many other ways to design phase-shifting circuits without departing from the spirit and scope of the present invention.

In quadrature demodulator 234, signal splitter 410 splits attenuated output signal 232 into a first portion, which is conveyed to first demodulator mixer 402, and a second portion, which is conveyed to second demodulator mixer 404. First demodulator mixer 402 receives the first portion of attenuated output signal 232 and also receives a phase delayed version of the reference signal from local oscillator circuit 408 via phase-shifting circuit 406. First demodulator mixer 402 multiplies the phase delayed reference signal with the first portion of attenuated output signal 232 to produce an analog baseband in-phase (I) component of attenuated output signal 232. Second demodulator mixer 404 receives the second portion of attenuated output signal 232 and also receives the reference signal generated by local oscillator circuit 408. Second demodulator mixer 404 multiplies the reference signal with the second portion of attenuated output signal 232 to produce an analog baseband quadrature (Q) component of attenuated output signal 232. The analog baseband in-phase component is conveyed to first A/D 412, which produces a digital baseband in-phase component 236 of attenuated output signal 232, and the analog baseband quadrature component is conveyed to second A/D 414, which produces a digital baseband quadrature component 238 of attenuated output signal 232. Digital baseband in-phase component 236 and digital baseband quadrature component 238 (collectively referred to as digital baseband output signal 237) are then conveyed to PVAG 240.

Figure 5:
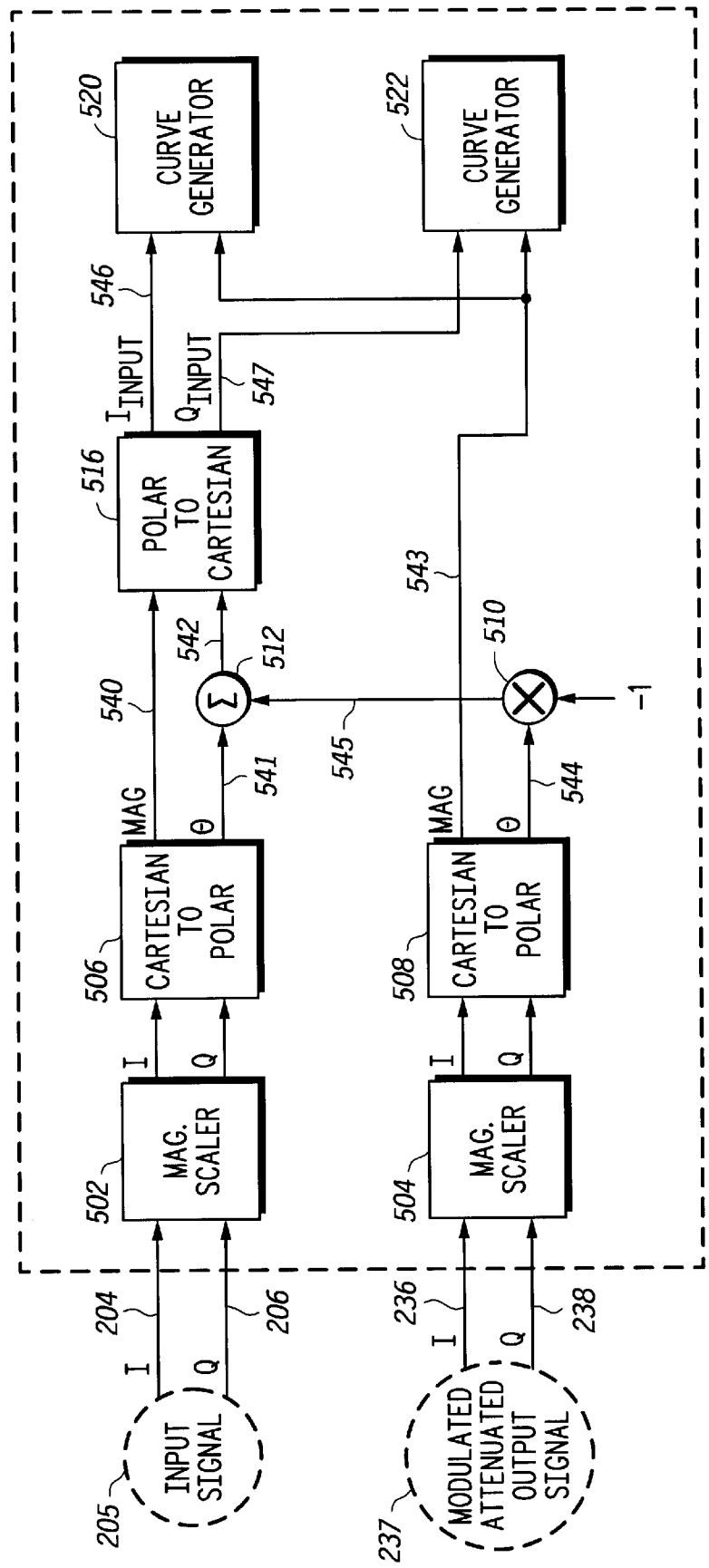
FIG. 5 is a block diagram of a predistortion vector amplitude generator of FIG. 2 in accordance with a preferred embodiment of the present invention.

FIG. 5 illustrates PVAG 240 in accordance with a preferred embodiment of the present invention. In the preferred embodiment, PVAG 240 includes a first magnitude scaler 502, a second magnitude scaler 504, a first PVAG cartesian-to-polar converter 506 coupled to first magnitude scaler 502, and a second PVAG cartesian-to-polar converter 508 coupled to second magnitude scaler 504. PVAG 240 further includes a phase inverter 510 coupled to second PVAG cartesian-to-polar converter 508, a summing junction 512 coupled to first PVAG cartesian-to-polar converter 506 and to phase inverter 510, and a PVAG polar-to-cartesian converter 516 coupled to first PVAG cartesian-to-polar converter 506 and to summing junction 512. PVAG further includes a first curve generator 520 and a second curve generator 522, wherein each curve generator 520, 522 is coupled to PVAG polar-to-cartesian converter 516 and to second PVAG cartesian-to-polar converter 508. Each curve generator 520, 522 is capable of executing a curve-fit algorithm that is stored in memory 106 or in a memory associated with DSP 104.

In the preferred embodiment, the curve-fit algorithm includes an algorithm that includes as inputs at least one dependent variable and at least one independent variable, which dependent variable and independent variable each include a data stream, and determines a function that expresses the dependent variable as a function of the independent variable. In the preferred embodiment, the curve-fit algorithm is a least squared error algorithm (LS) that minimizes the mean squared error of the determined function relative to the data; however, those who are of ordinary skill in the art realize that there are many algorithms for performing a curve-fit operation, such as Householder, Givens, or Fast Givens algorithms, that may be used without departing from the spirit and scope of the present invention.

In the preferred embodiment, first magnitude scaler 502 receives in-phase component 204 and quadrature component 206 of input signal 205. First magnitude scaler 502, preferably a factor multiplier, scales the magnitude of each of in-phase component 204 and quadrature component 206, preferably by multiplying the magnitude of each component 204, 206 by a first scaling factor, to produce a normalized in-phase component and a normalized quadrature component of input signal 205. Preferably the first scaling factor is based on the average power of input signal 205 and is applied to each component 204, 206 in order to adjust the magnitude of each component 204, 206. Furthermore, in the preferred embodiment, the first scaling factor is also based on an 'n' bit voltage or power range, such as a 16 bit voltage range, utilized by DSP 104 to digitally represent the magnitude of in-phase component 204 and quadrature component 206 of input signal 205, where 'n' is the number of bits required to provide the desired performance.

Second magnitude scaler 504 receives digital baseband in-phase component 236 and digital baseband quadrature component 238 of digital baseband output signal 237 from quadrature demodulator 234. Second magnitude scaler 504, preferably a factor multiplier, scales the magnitude of each of in-phase component 236 and quadrature component 238, preferably by multiplying the magnitude of each component by a second scaling factor determined similar to the factor of first magnitude scalar 502, to produce a normalized in-phase component and normalized quadrature component of digital baseband output signal 237. Preferably the second scaling factor is based on the average power of the analog baseband quadrature and in-phase components of attenuated output signal 232, and is applied to each component 236, 238 in order to adjust the magnitude of each component 236, 238. Similar to the first scaling factor, the second scaling factor preferably is also based on an 'n' bit voltage or power range utilized by DSP 104 to digitally represent the magnitude of in-phase component 204 and quadrature component 206 of input signal 205.

The normalized in-phase component and normalized quadrature component of input signal 205 are conveyed by first magnitude scalar 502 to first PVAG cartesian-to-polar converter 506. First PVAG cartesian-to-polar converter 506 converts the normalized cartesian representation of input signal 205 (i.e., the normalized in-phase and quadrature components of input signal 205) from a cartesian representation to a polar representation to produce a magnitude component 540 and a phase component 541 of the normalized version of input signal 205.

The normalized in-phase component and normalized quadrature component of digital baseband output signal 237 are conveyed by second magnitude scaler 504 to second PVAG cartesian-to-polar converter 508. Second PVAG cartesian-to-polar converter 508 converts the normalized cartesian representation of digital baseband output signal 237 (i.e, the normalized in-phase and quadrature components of digital baseband output signal 237) from a cartesian representation to a polar representation to produce a magnitude component 543 and a phase component 544 of the normalized version of digital baseband output signal 237.

Phase component 544 of the normalized version of digital baseband output signal 237 includes a desired phase modulation component, which desired phase modulation component includes information included in input signal 205 that is desired to be transmitted. Phase component 544 further includes an undesired phase modulation component that is the result of phase distortion introduced by RF power amplifier 218. In order to determine the undesired phase modulation component, the desired phase modulation component of phase component 544 is subtracted out of phase component 544 as follows. Phase component 544 is conveyed to a phase inverter 510, which phase inverter 510 inverts phase component 544 (i.e., multiplies it by −1) to produce an inverted phase component 545 of equal and opposite phase to phase component 544 (e.g., if the phase of phase component 544 is 30°, the phase of the inverted phase component is −30°). Inverted phase component 545 is conveyed to summing junction 512, where the inverted phase component 545 is summed with phase component 541 to produce phase component 542, which phase component represents the phase shift in output signal 220 due to distortion introduced by RF power amplifier 218.

Magnitude component 540 and phase component 542 represent a polar representation of a signal derived from the normalized version of input signal 205. Magnitude component 540 and phase component 542 are conveyed to first polar-to-cartesian converter 516. PVAG polar-to-cartesian converter 516 converts the signal represented by polar components 540, 542 from a polar representation (i.e., magnitude and phase components 540, 542) to a cartesian representation to produce an in-phase ($I_{INPUT}$) component 546 and an quadrature ($Q_{INPUT}$) component 547 of the signal derived from the normalized version of input signal 205.

Magnitude component 543 of the normalized version of digital baseband output signal 237 is conveyed to each of first curve generator 520 and second curve generator 522. Also conveyed to first curve generator 520 is in-phase ($I_{INPUT}$) component 546 of the signal derived from the normalized version of input signal 205. First curve generator 520 executes the curve-fit algorithm stored in memory 106 or in the memory associated with DSP 104, wherein inputs to the curve-fit algorithm include in-phase component 546 as a dependent variable and magnitude component 543 as an independent variable, to produce an in-phase component amplitude function $H_i(A(t))$. Preferably, $H_i(A(t))$ is of the form $H_i(A(t))=B_{i1} \times A(t)+B_{i2} \times A^2(t)+B_{i3} \times A^3(t)+ \ldots +B_{im} \times A^m(t)$, where 'm' represents the number of coefficients necessary to achieve a desired level of accuracy of the curve-fit, 'A(t)' represents the magnitude of an RF power amplifier 218 output signal, and the function $H_i(A(t))$ represents the amplitude of an in-phase component input into RF power amplifier 218 that will produce an RF power amplifier 218 output signal of magnitude A(t). The coefficients $B_{i1}$, $Bi_2$, ..., $B_{im}$, are generated by the curve fit algorithm executed by first curve generator 520.

Second curve generator 522, in addition to receiving magnitude component 543, also receives quadrature component 547 of the signal derived from the normalized version of input signal 205 from polar-to-cartesian converter 516. Second curve generator 522 executes the stored curve-fit algorithm, wherein inputs to the curve-fit algorithm include input signal 205 derived quadrature (Q) component 547 as a dependent variable and magnitude component 543 as an independent variable, to produce a quadrature component amplitude function $H_q(A(t))$. Preferably, $H_q(A(t))$ is of the form $H_q(A(t))=B_{q1} \times A(t)+B_{q2} \times A^2(t)+B_{q3} \times A^3(t)+ \ldots +B_{qm} \times A^m(t)$, where 'm' represents the number of coefficients necessary to achieve a desired level of accuracy of the curve-fit, 'A(t)' represents the magnitude of an RF power amplifier 218 output signal, and the function $H_i(A(t))$ represents the amplitude of a quadrature component input into RF power amplifier 218 that will produce an RF power amplifier 218 output signal of magnitude A(t). The coefficients $B_{i1}$, $B_{i2}$, ..., $B_{im}$, and $B_{q1}$, $B_{q2}$, ..., $B_{qm}$ are then each conveyed by their respective curve fit generators 520, 522 to vector amplitude source 109, where they are stored. The in-phase component amplitude function $H_i(A(t))$ and the quadrature component amplitude function $H_q(A(t))$ are each an RF power amplifier characterization function in that each characterize the performance of the RF power amplifier.

In an alternate embodiment of the present invention, vector amplitude source 209 includes a lookup table. In the alternate embodiment, first and second curve generators 520, 522 in addition to determining their respective in-phase and quadrature component amplitude functions $H_i(A(t))$ and $H_q(A(t))$, also execute their respectively determined component amplitude functions to produce a respective predistorted signal in-phase component amplitude value and a predistorted signal quadrature component amplitude value for each possible input value A(t). For example, in the preferred embodiment, DSP 104 includes a 16 bit range of potential in-phase component 204 and quadrature component 206 amplitude values (i.e., A(t)). First curve generator 520 produces a predistorted signal in-phase component amplitude value for each possible 16 bit input signal amplitude value, and second curve generator 522 produces a predistorted quadrature signal amplitude value for each possible 16 bit input signal amplitude value. The full range of 16 bit input signal amplitude values and the corresponding predistorted signal in-phase and quadrature component amplitude values are then stored in the lookup table.

Figure 6:
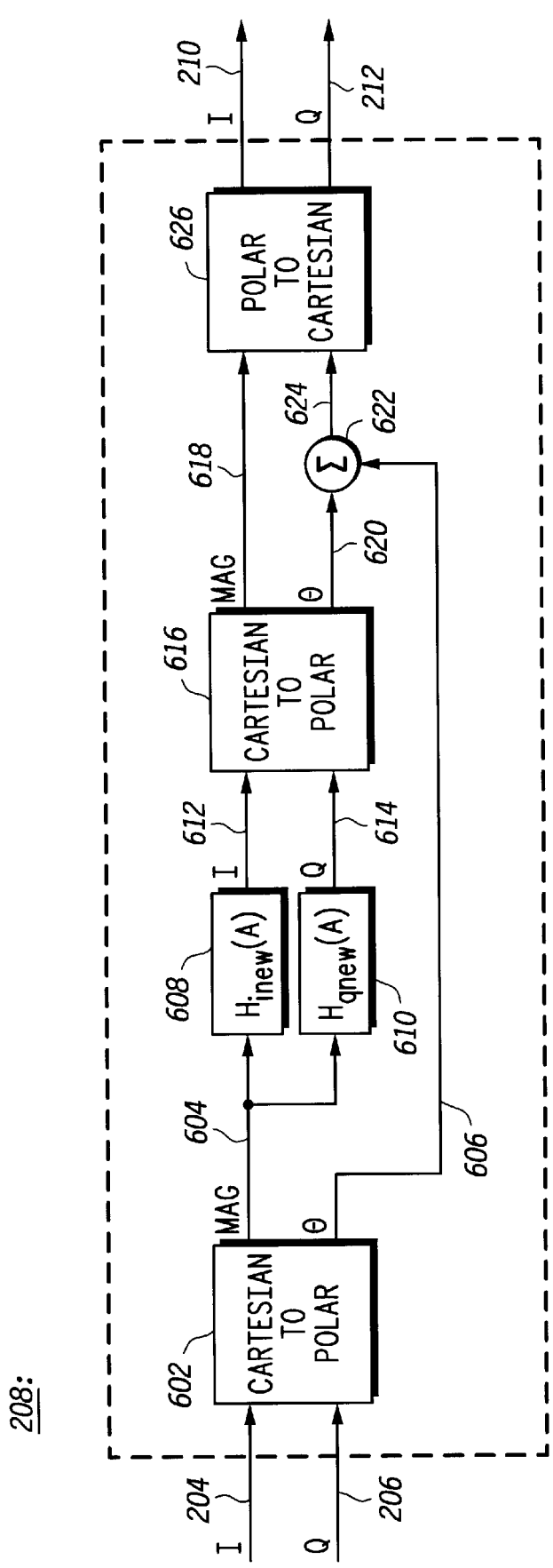
FIG. 6 is a block diagram of a predistorted input signal generator of FIG. 2 in accordance with a preferred embodiment of the present invention.

PISG 208 then determines a predistorted input signal (i.e., predistorted input signal components 210, 212) based on the in-phase and quadrature components 204, 206 of input signal 205 and by reference to vector amplitude source 209. FIG. 6 illustrates PISG 208 in accordance with a preferred embodiment of the present invention. PISG 208 preferably includes a first PISG cartesian-to-polar converter 602 that is coupled to an in-phase component generator 608 and a quadrature component generator 610, a second PISG cartesian-to-polar converter 616 that is coupled to in-phase component generator 608 and quadrature component generator 610, a summer 622 that is coupled to each of first and second cartesian-to-polar converters 602, 616, and a PISG polar-to-cartesian converter 626 that is coupled to summer 622 and to second PISG cartesian-to-polar converter 616.

First PISG cartesian-to-polar converter 602 receives input signal 205 from information source 102. First PISG cartesian-to-polar converter 602 converts input signal 205 from a cartesian representation (i.e., in-phase component 204 and quadrature component 206) to a polar representation to produce an amplitude component 604 and a phase component 606 of input signal 205. Amplitude component 604 is conveyed to both in-phase component generator 608 and quadrature component generator 610, and phase component 606 is conveyed to summer 622.

In-phase component generator 608 receives amplitude component 604 and generates a new in-phase component 612 based on amplitude component 604 and by reference to vector amplitude source 209. New in-phase component 612 is determined by the execution by in-phase component generator 608 of the algorithm $H_{i,new}(A)=B_{i1} \times A+B_{i2} \times A^2+B_{i3} \times A^3+ \ldots +B_{im} \times A^m$, which algorithm is stored in memory 106 or in a memory associated with DSP 104 and is executed by DSP 104. Coefficients $B_{i1}$, $B_{i2}$, ..., $B_{im}$ are obtained by in-phase component generator 608 from vector amplitude source 109 and the term 'A' is the amplitude of amplitude component 604. The term $H_{i,new}(A)$ in the above equation represents the amplitude of a new in-phase component 612.

Quadrature component generator 610 receives amplitude component 604 and generates a new quadrature component 614 based on amplitude component 604 and by reference to vector amplitude source 209. New quadrature component 614 is determined by the execution by quadrature component generator 610 of the algorithm $H_{q,new}(A)=B_{q1} \times A+B_{q2} \times A^2+B_{q3} \times A^3+ \ldots +B_{qm} \times A^m$, which algorithm is stored in memory 106 or in a memory associated with DSP 104 and is executed by DSP 104. Coefficients $B_{q1}$, $B_{q2}$, ... $B_{qm}$ are obtained by quadrature component generator 610 from vector amplitude source 209 and the term 'A' is again the amplitude of amplitude component 604. The term $H_{q,new}(A)$ in the above equation represents the amplitude of a new quadrature component 612. New in-phase component 612 and new quadrature component 614 are then used to determine, inter alia, the amplitude component of a signal that, when input into RF power amplifier 218, will produce an amplitude component of output signal 220 that was desired for a given input signal of amplitude A in the absence of any distortion.

In an alternate embodiment of the present invention, wherein vector amplitude source 209 includes a lookup table, in-phase component generator 608 generates a new in-phase component 612 corresponding to amplitude component 604 by reference to the predistorted in-phase signal amplitude value corresponding to amplitude component 604 in the lookup table. Similarly, quadrature component generator 610 generates a new quadrature component 614 corresponding to amplitude component 604 by reference to the predistorted quadrature signal amplitude value corresponding to amplitude component 604 in the lookup table.

New in-phase component 612 and new quadrature component 614 are conveyed by their respective component generators 608, 610 to second PISG cartesian-to-polar converter 616. Second PISG cartesian-to-polar converter 616 converts the new input signal from a cartesian representation (i.e., new in-phase component 612 and new quadrature component 614) to a polar representation to produce amplitude component 618 and phase component 620 of the new input signal.

Amplitude component 618 represents an amplitude component of a predistorted input signal that is based on input signal 205 (i.e., input signal in-phase component 204 and quadrature component 206). Phase component 620 represents a phase component of a predistorted input signal, less the phase modulation of the input signal, that is based on input signal 205. Phase component 620 is conveyed to summer 622 and added to input signal phase component 206 to produce predistorted input signal phase component 624. Predistorted input signal phase component 624 represents the phase component of a predistorted input signal, including the phase modulation of input signal 205. Together, magnitude component 618 and phase component 624 represent a polar representation of a predistorted input signal, which predistorted input signal represents input signal 205 as modified to compensate for the distortion introduced by RF power amplifier 218. Magnitude component 618 and phase component 624 are then conveyed to polar-to-cartesian converter 626. PISG polar-to-cartesian converter 626 converts the predistorted input signal from a polar representation (i.e., magnitude component 618 and phase component 624) to a cartesian representation to produce in-phase component 210 and quadrature component 212 of predistorted input signal 211.

In general, the predistortion signal loop produces a predistorted input signal that includes a modified version of the input signal, which modifications are meant to compensate for and cancel out the distortion introduced by an RF power amplifier to a signal input into the RF power amplifier. The predistortion signal loop characterizes the performance of the RF power amplifier by comparing derivatives of a desired baseband output signal (i.e., in-phase component 546 and quadrature component 547) to a derivative of a baseband version of the actual output signal (i.e., magnitude component 543) and determining equations (i.e., $H_i(A(t))$ and $H_q(A(t))$) that characterize relationships of the derivative signals. These equations characterize the performance of the RF power amplifier and indicate the adjustments to be made in the amplitude of an in-phase component and an quadrature component of an input signal in order to cancel the distortion introduced by the RF power amplifier. Then, in response to the receipt of an input signal from an information source, the predistortion loop produces a predistorted input signal based on the input signal and with reference to the component amplitude functions $H_i(A(t))$ and $H_q(A(t))$, which predistorted input signal includes both the information conveyed in the input signal and compensation for distortion introduced by the RF power amplifier. The predistortion signal loop of the present invention is performing an RF power amplifier performance characterization and therefore the characterizing equations need only be updated periodically, such as every few seconds or more, since the RF power amplifier performance is not likely to suddenly and discontinuously change.

Although the distortion introduced by RF power amplifier 218 is greatly reduced by the operation of the predistortion signal loop, the distortion is not completely eliminated. In order to further reduce the remaining distortion products, output signal 220 of RF power amplifier 218 is coupled to the feedforward correction loop. The feedforward correction loop receives an attenuated version of output signal 220, produces a correction signal by comparing the attenuated output signal to an modulated version of the input signal, amplifies the error signal, and injects the amplified error signal back into the output path of output signal 220 so that remaining distortion is further reduced from output signal 220.

The operation of the feedforward correction loop is as follows in accordance with a preferred embodiment of the present invention. Signal coupler 250, preferably a directional coupler, samples a portion of output signal 220 to produce attenuated output signal 256, which attenuated output signal 256 is conveyed to combiner 258. Information source 102 conveys input signal 205 to feedforward loop cartesian-to-polar converter 242. cartesian-to-polar converter 242 converts input signal 205 from a cartesian representation of input signal 205 (i.e. in-phase and quadrature components 204, 206) to a polar representation of input signal 205 to produce a magnitude component and a phase component of input signal 205. The magnitude component is conveyed to magnitude scaler 244, where the magnitude component is multiplied by a magnitude factor to produce a signal of comparable magnitude to attenuated output signal 256. The phase component is conveyed to phase offset 246, where a phase offset is introduced that results in a modulated signal produced by feedforward loop quadrature modulator 252, as described below, that is 180° out of phase with attenuated output signal 256. The magnitude scaled magnitude component and the phase offset phase component are then conveyed to polar-to-cartesian converter 248, which converts the two components from a polar representation of a signal to a cartesian representation of a signal to produce in-phase component 249 and quadrature component 251. In-phase component 249 and quadrature component 251 are conveyed to feedforward loop quadrature modulator 252. In-phase component 249 and quadrature component 251 are synchronized by DSP 104 with predistorted input signal in-phase component 210 and quadrature component 212 and are clocked out of DSP 104 in synch with the two predistorted input signal components. The advantage of including magnitude scaler 244 and phase offset 246 in DSP 104 is that it reduces the requirement for additional hardware in the feedforward correction loop.

Feedforward loop quadrature modulator 252 upconverts and combines in-phase component 249 and quadrature component 251 to produce a quadrature modulated input signal 254 at the same frequency as attenuated output signal 256. The preferred embodiment of feedforward loop quadrature modulator 252 is described in FIG. 3. A first D/A 312 receives in-phase component 249 and converts in-phase component 249 to an analog in-phase component that is conveyed to a first modulator mixer 302. A second D/A 314 receives quadrature component 251 and converts quadrature component 251 to an analog quadrature component that is conveyed to a second modulator mixer 304. Each mixer 302, 304, in addition to receiving their respective analog in-phase and quadrature components, also receives a reference signal generated by local oscillator 308. First modulator mixer 302 receives the reference signal via a phase-shifting circuit 306, which phase-shifting circuit 306 preferably includes a quarter-wavelength transmission line at the frequency of interest and introduces an approximately 90° phase delay to the reference signal. In quadrature modulator 252, the frequency of the reference signal is frequency of attenuated output signal 256. The frequency of the reference signal generated by local oscillator 308 in quadrature modulator 252 is the same as the frequency of the reference signal generated by the local oscillator in input quadrature modulator 214, and in an alternate embodiment of the present invention the two reference signal may be generated by a common reference signal source.

First modulation mixer 302 multiplies the analog in-phase component with the phase delayed reference signal to produce an upconverted analog in-phase component. Second modulation mixer 304 multiplies the analog quadrature component with the reference signal to produce an upconverted analog quadrature component. The upconverted analog in-phase and quadrature components are conveyed to combiner 310, preferably a quadrature combiner, where the upconverted analog in-phase and quadrature components are combined to produce quadrature modulated input signal 254. Quadrature modulated input signal 254 is then conveyed to combiner 258.

Combiner 258 combines quadrature modulated input signal 254 and attenuated output signal 256 and produces an error signal 260 based on a difference between the two signals 254, 256. Error signal 260 is conveyed to vector modulator 261, where the phase and amplitude of error signal 260 are adjusted for synchronization and subsequent combination with output signal 220. The phase and amplitude adjusted error signal is conveyed to error amplifier 262, where the phase and amplitude adjusted error signal is amplified to a suitable power level to produce an amplified error signal, and the amplified error signal is conveyed to output signal comparator 222.

Output signal comparator 322 receives the amplified error signal and also receives output signal 220 from RF power amplifier 218. Comparator 222 compares the amplified error signal and output signal 220 and produces a signal to be transmitted 224 based on a difference between the two compared signals. Residual distortion that is introduced by RF power amplifier 218 and not cancelled by predistorted input signal 216 is cancelled by comparator 222 to produce a highly linear amplified and upconverted version of the input signal.

In sum, the present invention provides for correction of distortion introduced by an RF power amplifier by producing a predistorted input signal that is based on the information signal input into the transmitter, which transmitter includes the RF power amplifier. The predistorted input signal is generated by a predistortion signal loop and is based on RF power amplifier characterization functions determined by the predistortion signal loop. The RF power amplifier characterization functions characterize the performance of the RF power amplifier by describing relationships between the signal input into the RF power amplifier and a resultant signal output by the RF power amplifier, which resultant output signal includes both a desired amplified version of the input signal and undesired distortion products. The RF power amplifier characterization functions are used to determine the amplitudes of components of the predistorted input signal and include amplitude compensation designed to cancel out the undesired distortion products characterized by the RF power amplifier characterization functions. The predistorted input signal includes multiple signal components that are modulated by the input quadrature modulator and input into the RF power amplifier, with the result that the undesired distortion products of a signal output by the RF power amplifier are greatly reduced. A feedforward correction loop then provides compensation for residual distortion not corrected by the predistorted input signal.

Figure 7:
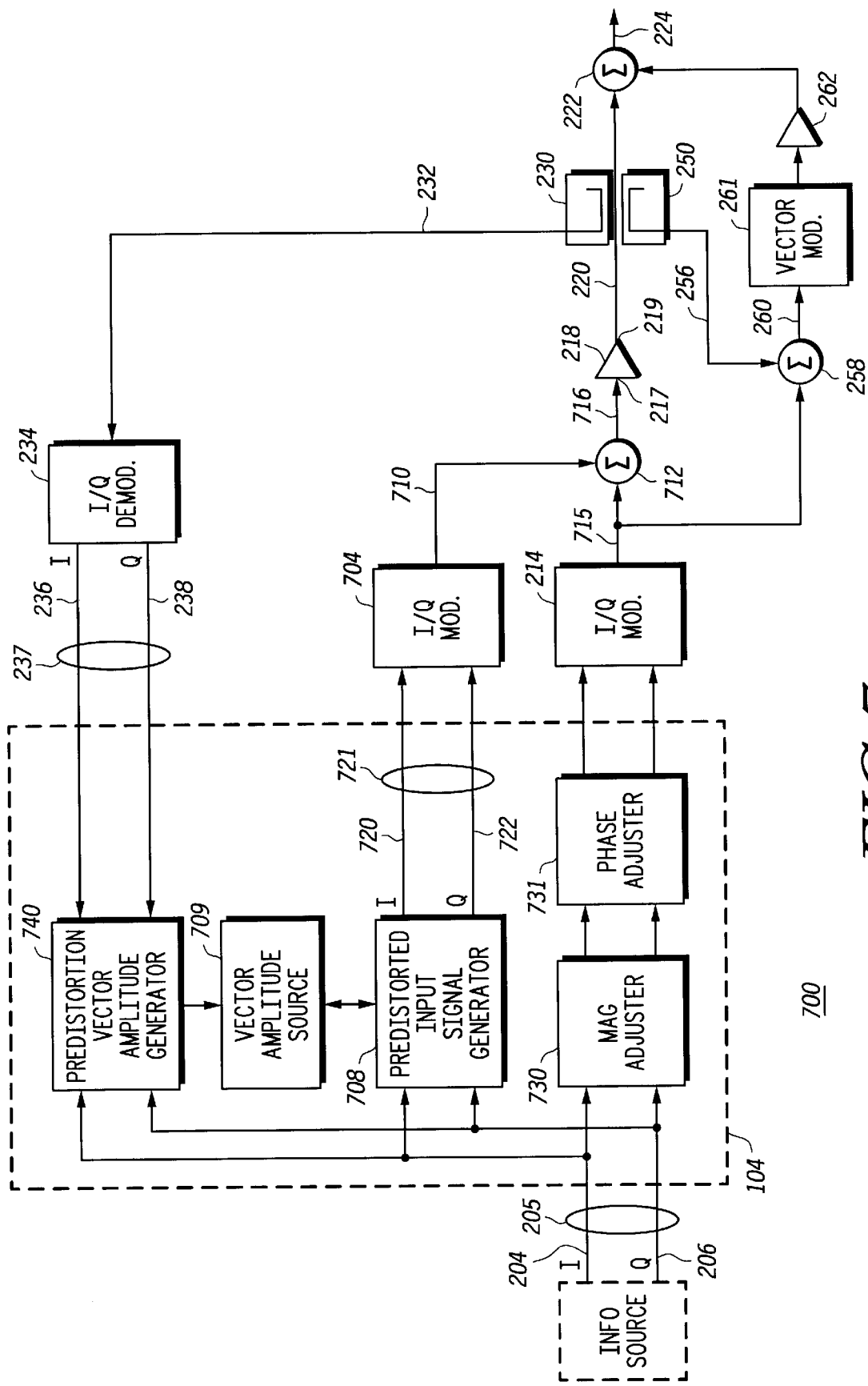
FIG. 7 is a block diagram of a transmitter in accordance with an alternate embodiment of the present invention

FIG. 7 illustrates a transmitter 700 in accordance with an alternate embodiment of the present invention. Unlike transmitter 200, in transmitter 700 the predistortion input signal is determined by generating predistortion components separate form the input signal 205 and then combining these signals at RF. Similar to transmitter 200, transmitter 700 includes a radio frequency (RF) power amplifier 218 that includes an input port 217 and an output port 219, an input quadrature modulator 214, and an output signal comparator 222, preferably a subtractor, coupled to output port 219. Unlike transmitter 200, transmitter 700 further includes an input signal combiner 712 coupled between input quadrature modulator 214 and input port 217 of RF power amplifier 218, a phase adjuster 731 coupled to input quadrature modulator 214, and a magnitude adjuster 730 coupled to phase adjuster 731. Transmitter 700 further includes a predistortion signal loop coupled to output port 219 of RF power amplifier 218 and to combiner 712, and a feedforward correction loop coupled to input quadrature modulator 214 and to output signal comparator 222.

The predistortion signal loop of transmitter 700 preferably includes a predistortion loop signal coupler 230 coupled to a quadrature demodulator 234, a predistorted vector amplitude generator (PVAG) 740 coupled to quadrature demodulator 234, a vector amplitude source 709 coupled to PVAG 740, a predistorted input signal generator (PISG) 708 coupled to vector amplitude source 209, and a predistortion loop quadrature modulator 704 coupled to PISG 708. PVAG 740, PISG 708, magnitude adjuster 730, and phase adjuster 731 are each embodied in DSP 104 and the functions of PVAG 740, PISG 708, magnitude adjuster 730, and phase adjuster 731 are preformed by the execution, by DSP 104, of algorithms stored in memory 106 or in a memory associated with DSP 104. Vector amplitude source 709 is a database that is contained either in memory 106 or in a memory associated with DSP 104, which database includes initialized coefficient values based either on factory testing of the transmitter or on a selection of predetermined values by a transmitter designer.

The feedforward correction loop of transmitter 700 includes a feedforward loop combiner 258, preferably a summation junction with a 180° phase shift, coupled to input quadrature modulator 214 and to a feedforward loop signal coupler 250, a vector modulator 261 coupled to combiner 258, and an error amplifier 262 coupled to vector modulator 261 and to output signal comparator 222.

The operation of transmitter 700 is as follows in accordance with the alternate embodiment. Similar to the preferred embodiment, information source 102 sources an input signal 205, preferably a quadrature modulation signal, to transmitter 700. Input signal 205 preferably includes an in-phase (I) component 204 and an out-of phase (Q) component 206. Input signal 205 is conveyed to magnitude adjuster 730, which adjusts a magnitude of input signal 205. The magnitude adjusted input signal is then conveyed to phase adjuster 731, which adjusts a phase of the magnitude adjusted input signal. The magnitude and phase adjusted input signal is then conveyed to quadrature modulator 214, which modulates the magnitude and phase input signal to a desired frequency of an output signal 220 to produce a modulated input signal 715. The magnitude and phase adjustments made by magnitude and phase adjusters 730 and 731 are such that the magnitude and phase of modulated input signal 715 matches the magnitude and phase of a modulated predistortion component signal 710 at combiner 712, which modulated predistortion component signal 710 is produced by the predistortion signal loop.

Combiner 712 combines modulated input signal 715 and modulated predistortion component signal 710 to produce modulated predistorted input signal 716. Modulated predistorted input signal 716 is conveyed by combiner 712 to RF power amplifier 218, which amplifies modulated predistorted input signal 716 to produce output signal 220. Output signal 220 is conveyed to output signal comparator 222, where residual distortion that is introduced by RF power amplifier 218 and not cancelled by predistortion component signal 710 is cancelled by the feedforward correction path as described below to produce a highly linear signal for transmission 224.

The operation of the predistortion signal loop in transmitter 700 is as follows. Predistortion loop signal coupler 230 is coupled to output port 219 of RF power amplifier 218. Signal coupler 230 samples a portion of output signal 220 to produce attenuated output signal 232, which attenuated output signal 232 is conveyed to quadrature demodulator 234. Quadrature demodulator 234 produces, as described above, a digital baseband in-phase component 236 and a digital baseband quadrature component 238 (collectively referred to as digital baseband output signal 237) of attenuated output signal 232, and conveys digital baseband output signal 237 to PVAG 740.

Figure 8:
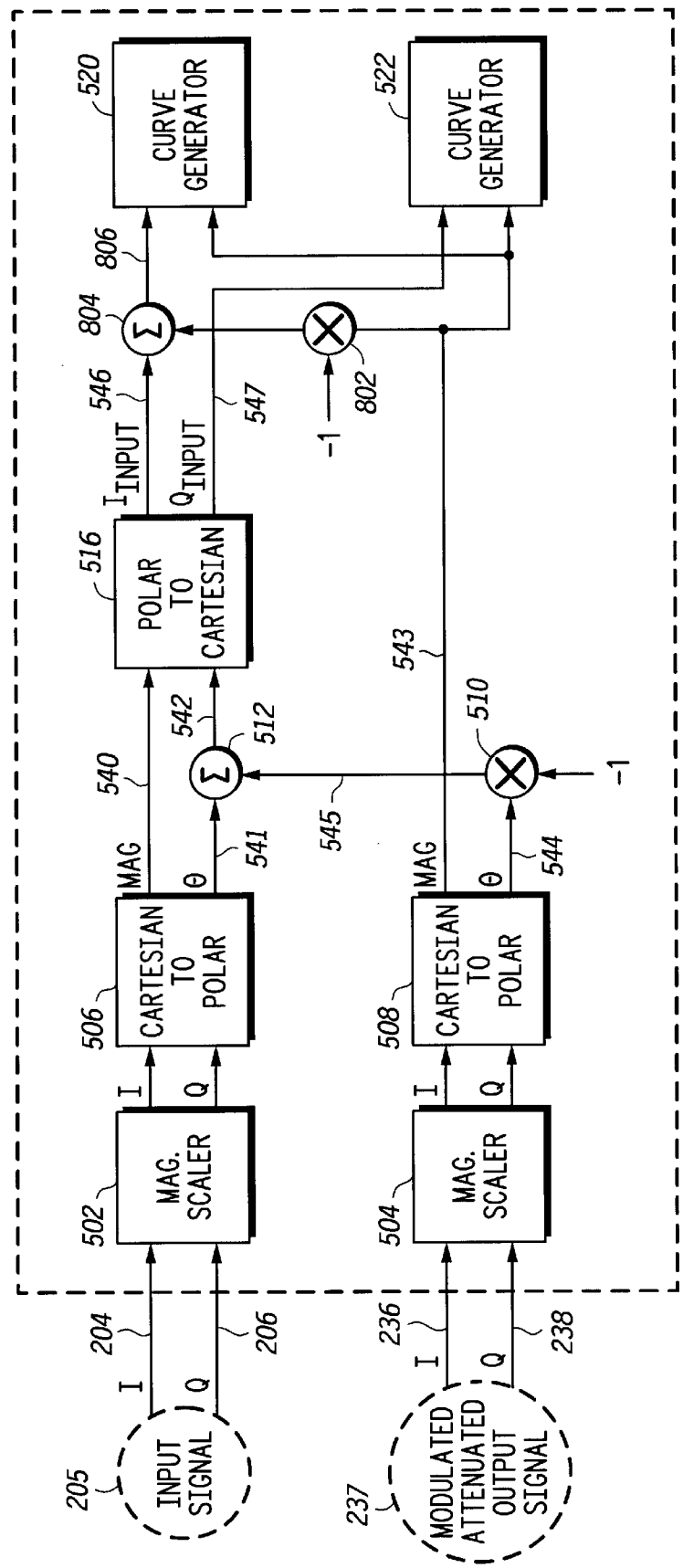
FIG. 8 is a block diagram of a predistortion vector amplitude generator of FIG. 7 in accordance with an alternate embodiment of the present invention.

FIG. 8 is an illustration of PVAG 740 in accordance with the alternate embodiment of the present invention as described in FIG. 7. The composition of PVAG 740 is similar to PVAG 240 except that PVAG 740 further includes a magnitude inverter 802 coupled to second PVAG cartesian-to-polar converter 508 and a second summing junction 804 coupled between PVAG polar-to-cartesian converter 516 and first curve generator 520.

The operation of PVAG 740 is also similar to PVAG 240 except that magnitude component 543 of the normalized version of digital baseband output signal 237, in addition to being conveyed to each of first curve generator 520 and second curve generator 522, is also conveyed to magnitude inverter 802. Magnitude inverter 802 inverts magnitude component 543 by multiplying it by a factor of '−1' and conveys the inverted magnitude component to second summing junction 804. Also conveyed to second summing junction 518 is in-phase component 546 of the signal derived from the normalized version of input signal 205. In-phase component 546 and the inverted magnitude component are combined by summing junction 804 to produce a modified in-phase component 806 of the signal derived from the normalized version of input signal 205, which modified in-phase component 806 is conveyed to first curve generator 520 (instead of in-phase component 546 in PVAG 240).

Similar to first curve generator 520 of PVAG 240, first curve generator 520 of PVAG 740 executes a curve fit algorithm based on magnitude component 543 as an independent variable and modified in-phase component 806 as a dependent variable to produce a predistortion in-phase component amplitude function $P_i(A(t))$ of the form $P_i(A(t))= C_{i1} \times A(t) + C_{i2} \times A^2(t) + C_{i3} \times A^3(t) + \ldots + C_{im} \times A^m(t)$. Also, similar to second curve generator 522 of PVAG 240, second curve generator 522 of PVAG 740 executes a curve fit algorithm based on magnitude component 543 as an independent variable and quadrature component 547 as a dependent variable to produce a predistortion quadrature component amplitude function $P_q(A(t))$ of the form $P_q(A(t))=C_{q1} \times A(t)+C_{q2} \times A^2(t)+C_{q3} \times A^3(t)+ \ldots +C_{qm} \times A^m(t)$. In the functions $P_i(A(t))$ and $P_q(A(t))$, 'm' represents the desired number of coefficients to achieve a desired level of accuracy of the curve fit, 'A(t)' represents the magnitude of an RF power amplifier 218 output signal, the function $P_i(A(t))$ represents the amplitude of a in-phase component designed to compensate for a predistortion component of an RF power amplifier 218 output signal of magnitude A(t), and $P_q(A(t))$ represents the amplitude of a quadrature component designed to compensate for a predistortion component of an RF power amplifier 218 output signal of magnitude A(t). The coefficients $C_{i1}, C_{i2}, \ldots, C_{im}$, and $C_{q1}, C_{q2}, , C_{qm}$ are then each conveyed by their respective curve fit generators 520, 522 to vector amplitude source 709, where they are stored.

The composition and operation of PISG 708 is similar to PISG 208 except that in-phase component generator 608 of PISG 708 determines in-phase component 612 by the execution of algorithm $P_{i,new}(A)=C_{i1} \times A+C_{i2} \times A^2+C_{i3} \times A^3+ \ldots +C_{im} \times A^m$ instead of the algorithm for $H_{i,new}(A)$, and quadrature component generator 610 of PISG 708 determines quadrature component 614 by the execution of algorithm $P_{q,new}(A)=C_{q1} \times A+C_{q2} \times A^2+C_{q3} \times A^3+ \ldots +C_{qm} \times A^m$ instead of the algorithm for $H_{iq new}(A)$. The algorithms for $P_{i,new}(A)$ and $P_{q,new}(A)$ are stored in memory 106 or in a memory associated with DSP 104 and are executed by DSP 104. Coefficients $C_{i1}, C_{i2}, \ldots, C_{im}$ and $C_{q1}, C_{q2}, \ldots, C_{qm}$ are obtained by PISG 708 from vector amplitude source 709, and the term 'A' is the amplitude of amplitude component 604 as in PISG 208. PISG 708 produces an in-phase component 720 and a quadrature component 722 of a predistortion component signal 721, as opposed to PISG 208 which produces an in-phase component 210 and a quadrature component 212 of predistortion input signal 211. Whereas predistortion input signal 211 includes the amplitude and phase of the signal that will be input into RF power amplifier 218, predistortion component signal 721 is an adjustment signal that is used to adjust the amplitude and phase of modulated input signal 715 to compensate for the distortion effects of RF power amplifier 218.

In-phase component 720 and a quadrature component 722 of a predistortion component signal 721 are then conveyed to predistortion loop quadrature modulator 704, which operates similar to input quadrature modulator 214 as described in FIG. 3 and modulates components 720 and 722 to produce a modulated predistortion component signal 710 at a desired frequency of output signal 220. Modulated predistortion component signal 710 is conveyed to combiner 712, and combiner 712 combines modulated predistortion component signal 710 and modulated input signal 715 to produce a predistorted input signal 716 that is conveyed to RF power amplifier 218 for subsequent amplification.

As in the preferred embodiment, although the predistortion signal loop greatly reduces the distortion introduced by RF power amplifier 218, the distortion is not completely eliminated. In order to cancel the remaining distortion, output signal 220 of RF power amplifier 218 is coupled to the feedforward correction loop of transmitter 700. Similar to the feedforward correction loop of transmitter 200, signal coupler 250 of the feedforward correction loop of transmitter 700 samples output signal 220 and produces an attenuated output signal 256, which attenuated output signal 256 is conveyed to combiner 258. Also conveyed to combiner 258 is at least a portion of modulated input signal 715. Combiner 258 compares attenuated output signal 256 to the at least a portion of modulated input signal 715 and produces an error signal 260 based on a difference between the two signals 256, 715. Error signal 260 is conveyed to vector modulator 261, where the phase and amplitude of error signal 260 are adjusted for synchronization and subsequent combination with output signal 220. The phase and amplitude adjusted error signal is conveyed to error amplifier 262, where the phase and amplitude adjusted error signal is amplified to a suitable power level to produce an amplified error signal, and the amplified error signal is conveyed to output signal comparator 222.

Output signal comparator 222 receives the amplified error signal and also receives output signal 220 from RF power amplifier 218. Comparator 222 compares the amplified error signal and output signal 220 and produces a signal to be transmitted 224 based on a difference between the two compared signals. Residual distortion that is introduced by RF power amplifier 218 and not cancelled by predistorted input signal 216 is cancelled by comparator 222 to produce a highly linear amplified and upconverted version of the input signal.

In general, the alternate embodiment as described in FIG. 7 provides a predistortion feedback loop that produces a predistortion signal that is combined with the input signal and is designed designed to cancel out the distortion introduced to an input signal by an RF power amplifier. Similar to the preferred embodiment, the predistortion signal is based on a characterization of the performance of the RF power amplifier by the predistortion signal loop. However, unlike the preferred embodiment wherein a new input signal is generated by the predistortion signal loop, in the alternate embodiment the predistortion signal loop produces a signal merely designed to counterbalance the distortion introduced and to be added to the input signal.

Figure 10:
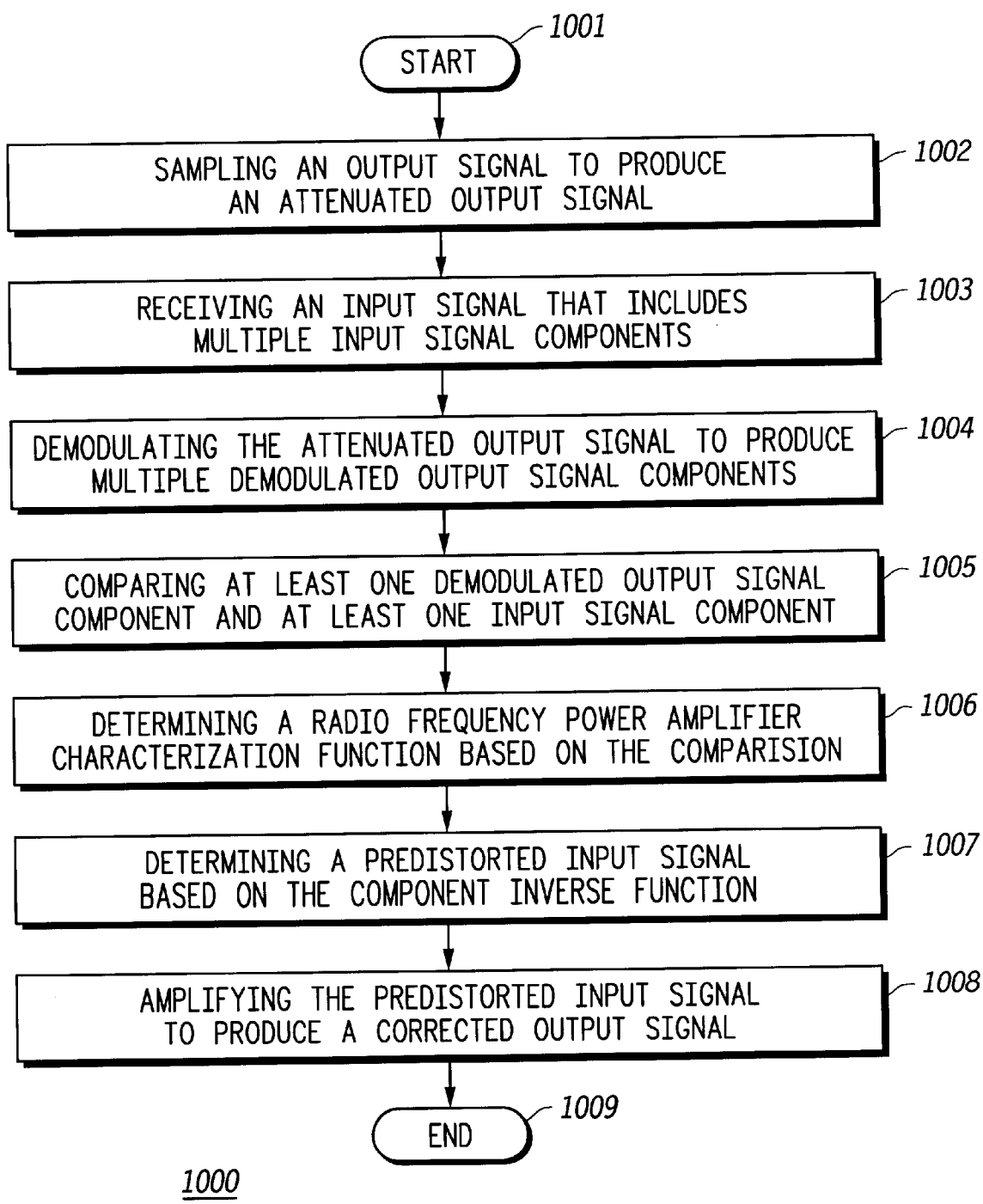
FIG. 10 is a logic flow diagram of steps executed by a transmitter to correct distortion in a radio frequency power amplifier in accordance with a preferred embodiment of the present invention.

FIG. 10 is a logic flow diagram 1000 of steps executed by a transmitter to correct distortion in accordance with a preferred embodiment of the present invention. The transmitter preferably includes a processor, preferably a DSP, coupled to a memory and to an input quadrature modulator, an RF power amplifier that includes an input port and an output port, which input port is coupled to the input quadrature modulator, and a predistortion feedback loop that is coupled to the input quadrature modulator and to the output port of the RF power amplifier. The distortion is introduced to the transmitter by the RF power amplifier when the RF power amplifier amplifies a signal input into the input port of the RF power amplifier to produce an output signal. In the preferred embodiment, the predistortion feedback loop includes a predistortion loop signal coupler coupled to a quadrature demodulator, a predistortion vector amplitude generator (PVAG) coupled to the quadrature demodulator, a vector amplitude source coupled to the PVAG, and a predistorted input signal generator (PISG) coupled to the vector amplitude source as described above with respect to FIG. 2. Preferably, the PVAG and PISG are embodied (a "software embodiment") as algorithms stored in the memory or in a memory associated with the DSP, and the steps described below as being performed by the PVAG and PISG are performed by the execution of the algorithms by the DSP.

The logic flow begins (1001) when the transmitter, preferably the predistortion loop signal coupler, samples (1002) the output signal to produce an attenuated output signal, attenuated output signal is then conveyed to the quadrature demodulator. The transmitter, preferably each of the predistortion vector amplitude generator and the predistorted input signal generator, also receives (1003) an input signal from an information source, preferably from a DSP external to the transmitter. The input signal preferably includes a quadrature modulation signal that includes multiple signal components, preferably an in-phase signal component and a quadrature signal component.

The transmitter, preferably the quadrature demodulator, demodulates (1004) the attenuated output signal to produce multiple output signal components. In the preferred embodiment, the step of demodulating (1004) the attenuated output signal includes the steps of splitting the attenuated output signal into multiple signal components, preferably an in-phase component and a quadrature component, and down converting each component of the attenuated output signal to a baseband frequency to produce a baseband in-phase output signal component and a baseband quadrature output signal component of the attenuated output signal. The baseband in-phase output signal component, the baseband quadrature output signal component, and the input signal are conveyed to the PVAG, which compares (1005) at least one baseband output signal component and at least one input signal component.

In the preferred embodiment, the step of comparing (1005) includes the following steps. The PVAG magnitude scales the in-phase and quadrature components of the quadrature modulation signal and magnitude scales the baseband in-phase and quadrature components of the attenuated output signal. The PVAG converts the magnitude scaled in-phase and quadrature components of the quadrature modulation signal from a cartesian representation to a polar representation to produce normalized magnitude component and a normalized phase component of the quadrature modulation signal, and converts the magnitude scaled baseband in-phase and quadrature components of the attenuated output signal from a cartesian representation to a polar representation to produce a normalized magnitude component and a normalized phase component of the attenuated output signal. Preferably, the DSP performs the cartesian-to-polar conversions by executing a cartesian-to-polar conversion algorithm stored in the memory or in a memory associated with the DSP.

In the preferred embodiment, the step of comparing (1005) further includes the following steps. The PVAG inverts the normalized phase component of the attenuated output signal to produce an inverted phase component of the attenuated output signal and sums the inverted phase component with the normalized phase component of the quadrature modulation signal to produce a modified normalized phase component of the quadrature modulation signal. The PVAG converts the normalized magnitude component and the modified normalized phase component of the quadrature modulation signal from a polar representation (i.e., the normalized magnitude component and the modified normalized phase component) to a cartesian representation to produce a curve generating in-phase component and a curve generating quadrature component of the quadrature modulation signal. Preferably, the DSP performs the polar-to-cartesian conversions by executing a polar-to-cartesian conversion algorithm stored in the memory or in a memory associated with the DSP.

The transmitter, preferably the PVAG, then determines (1006) an RF power amplifier characterization function based on the comparison of the at least one baseband output signal component and the at least one input signal component. In the preferred embodiment, the RF power amplifier characterization function includes an in-phase component amplitude function and a quadrature component amplitude function. In addition, the at least one baseband output signal component preferably includes the normalized magnitude component of the attenuated output signal, and the at least one input signal component preferably includes the curve generating in-phase component and the curve generating quadrature component of the quadrature modulation signal.

In the preferred embodiment, the step of determining (1006) a RF power amplifier characterization function includes the following steps. The PVAG determines the in-phase component amplitude function based on the curve generating in-phase component of the quadrature modulation signal and the normalized magnitude component of the attenuated output signal. Preferably, the in-phase component amplitude function is of the form $H_i(A(t))$, wherein $H_i(A(t))=B_{i1}\times A(t)+B_{i2}\times B^2(t)+A_{i3}\times B^3(t)+\ldots +A_{im}\times B^m(t)$. The PVAG also determines the quadrature component amplitude function based on the curve generating quadrature component of the quadrature modulation signal and normalized magnitude component of the attenuated output signal. Preferably, the quadrature amplitude function is of the form $H_q(A(t))$, wherein $H_q(A(t))=B_{q1}\times A(t)+B_{q2}\times A^2(t)+B_{q3}\times A^3(t)+\ldots +B_{qm}\times A^m(t)$. Preferably, the DSP determines the in-phase amplitude function and quadrature amplitude function by the execution of a curve-fit algorithm stored in the memory or in a memory associated with the DSP. Preferably, the normalized magnitude component of the attenuated output signal serves as an independent variable in both instances of execution of the curve-fit algorithm, the curve generating in-phase component of the quadrature modulation signal serves as a dependent variable in the determination of the in-phase component amplitude function, and the curve generating quadrature component of the quadrature modulation signal serves as a dependent variable in the determination of the in-phase component amplitude function. Preferably the coefficients are stored in the in the vector amplitude source, which preferably includes a database in the memory.

In an alternate embodiment of the present invention, instead of the steps of storing the coefficients, the step of determining (1006) a RF power amplifier characterization function further includes the steps of executing, by the PVAG, the in-phase component amplitude function for each possible value of A(t) to produce a pre-predistorted signal in-phase component amplitude corresponding to each possible value of A(t), and executing, by the PVAG, the quadrature component inverse function for each possible value of A(t) to produce a pre-predistorted signal quadrature component amplitude corresponding to each possible value of A(t). The possible values of A(t), and the pre-predistorted signal in-phase component amplitude and pre-predistorted signal quadrature component amplitude corresponding to each possible value of A(t), are then stored in the vector amplitude source.

In the preferred embodiment, the transmitter, preferably the PISG, then determines (1007) a predistorted input signal, based on the RF power amplifier characterization function, to correct distortion in the transmitter. Preferably, the step of determining (1007) a predistorted input signal includes the following steps. The PISG converts the input signal from a cartesian format (i.e., in-phase and quadrature components) to a polar format to produce a input signal amplitude component and an input signal phase component. The PISG then determines a new input signal in-phase component amplitude $H_{i,new}(A)$ based on the input signal amplitude component (A) and with reference to the vector amplitude source. Preferably the step of determining the new input signal in-phase component amplitude $H_{i,new}(A)$ includes the steps of obtaining the coefficients $B_{i1}, B_{i2}, \ldots, B_{im}$ from the vector amplitude source and executing a predistorted input signal in-phase component amplitude algorithm, preferably $H_{i,new}(A)=B_{i1}\times A+B_{i2}\times A^2+B_{i3}\times A^3+\ldots +B_{im}\times A^m$. The PISG also determines a new input signal quadrature component amplitude $H_{q,new}(A)$ based on the input signal amplitude component (A) and with reference to the vector amplitude source. Preferably the step of determining the new input signal quadrature component amplitude $H_{q,new}(A)$ includes the steps of obtaining the coefficients $B_{q1}, B_{q2}, \ldots, B_{qm}$ from the vector amplitude source and executing a predistorted input signal in-phase component amplitude algorithm, preferably $H_{q,new}(A)=B_{q1}\times A+B_{q2}\times A^2+B_{q3}\times A^3+\ldots +B_{qm}\times A^m$. Preferably the predistorted input signal in-phase and quadrature component amplitude algorithms are stored in the memory or in a memory associated with the DSP and are executed by the DSP.

In an alternate embodiment of the present invention, the new signal in-phase component amplitude and new signal quadrature component amplitude for a given input signal amplitude component 'A' have already been calculated by the PVAG and stored in the vector amplitude source. In the alternate embodiment, the step wherein the PISG determines the pre-predistorted signal in-phase component amplitude and pre-predistorted signal quadrature component amplitude includes the step of obtaining the already determined amplitudes from the vector amplitude source.

In the preferred embodiment, the step of determining (1007) a predistorted input signal further includes the following steps. The PISG determines a new input signal in-phase component based on the new input signal in-phase component amplitude and a new input signal quadrature component based on the new input signal in-phase component amplitude. The PISG converts the new input signal in-phase component and the new input signal quadrature component from a cartesian representation of a signal to a polar representation of a signal to produce a new input signal magnitude component and a new input signal phase component. The PISG sums the new input signal phase component with the input signal phase component to produce a modified new input signal phase component. The PISG then converts the new input signal amplitude component and the modified new input signal phase component from a polar representation of a signal to a cartesian representation of a signal to produce a predistorted input signal in-phase component and a predistorted input signal quadrature component, which components are components of a predistorted input signal that corrects the distortion in the transmitter. The PISG conveys the predistorted input signal in-phase component and the predistorted input signal quadrature component to the input quadrature modulator, and the input quadrature modulator modulates the predistorted input signal in-phase component and the predistorted input signal quadrature component to produce the predistorted input signal at a frequency of the output signal.

In the preferred embodiment, the input quadrature modulator conveys the predistorted input signal to the RF power amplifier. The RF power amplifier amplifies (1008) the predistorted input signal to produce a corrected output signal, and the logic flow ends (1009).

In another alternate embodiment of the present invention as described in FIG. 10, the step of comparing (1005) includes the additional steps wherein a PVAG, as described in FIG. 8, inverts the normalized magnitude component of the attenuated output signal to produce an inverted magnitude component and sums the inverted magnitude component with the curve generating in-phase component of the quadrature modulation signal to produce a modified curve generating in-phase component of the quadrature modulation signal. In the alternate embodiment, the step of determining (1006) an RF amplifier characterization function then includes the step of determining an in-phase component amplitude function based on the modified curve generating in-phase component of the quadrature modulation signal, as opposed to the curve generating in-phase component of the quadrature modulation signal, and the normalized magnitude component of the attenuated output signal. In the alternate embodiment, the predistorted input signal determined in step (1007) represents an adjustment to a quadrature modulation input signal to compensate for distortion introduced in the transmitter by the RF power amplifier, as opposed to representing the adjusted quadrature modulated input signal. Therefore, the alternate embodiment includes the additional steps of modulating the quadrature modulation input signal to a desired frequency of the output signal to produce a quadrature modulated input signal, modulating the predistorted input signal to a desired frequency of the output signal to produce a modulated predistorted input signal, and combining the modulated predistorted input signal and the quadrature modulated input signal to produce an RF amplifier input signal, and the step of amplifying (1008) includes the step of amplifying the combined modulated predistorted input signal and quadrature modulated input signal to produce a corrected output signal.

In general, the present invention as described in FIG. 10 provides a method for correcting distortion in a transmitter by producing a predistorted input signal that is based on the information signal input into the transmitter, which transmitter includes an RF power amplifier. The method provides for the determination of an RF power amplifier characterization function that characterizes the amplification performance of the RF power amplifier. That is, the RF power amplifier characterization function characterizes a relationship between a signal input into the RF power amplifier and a resulting signal output by the RF power amplifier. The resultant signal output by the RF power amplifier includes both a desired amplified version of the input signal and undesired distortion products. The method then provides for the determination of component inverse functions based on the RF power amplifier characterization function. The component inverse functions are used to determine amplitudes of components of a predistorted signal to be input into the RF power amplifier. The amplitudes include compensation for the undesired distortion products and are designed to reduce the undesired distortion products so that the signal output by the RF power amplifier includes only a desired amplified version of the input signal.

Figure 11:
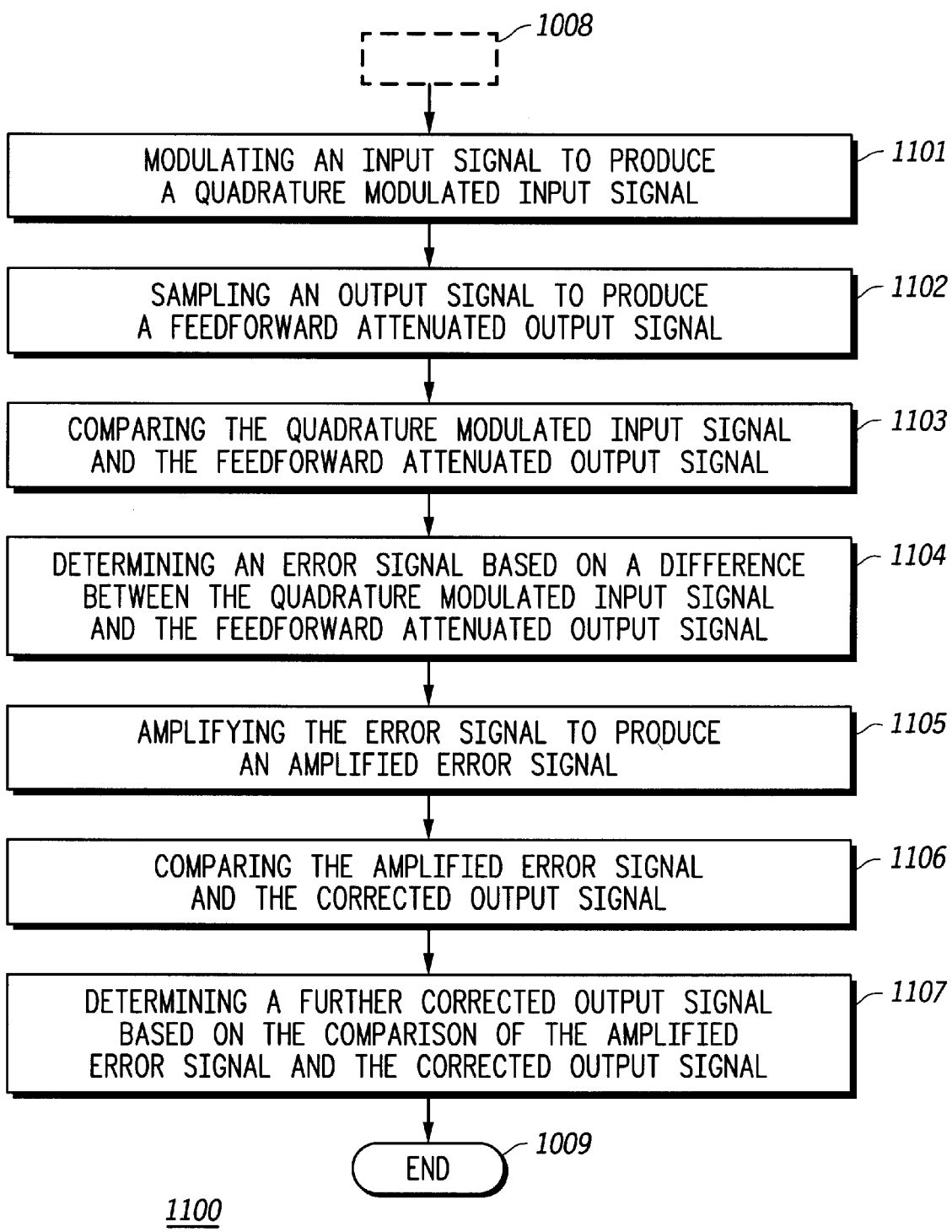
FIG. 11 is a logic flow diagram of additional steps executed by a transmitter to correct distortion in a radio frequency power amplifier in accordance with an alternate embodiment of the present invention.

FIG. 11 is a logic flow diagram 1100 of additional steps executed by a transmitter to correct distortion in accordance with yet another alternate embodiment of the present invention. In the alternate embodiment, the transmitter further includes an output signal comparator coupled to the output port of the RF power amplifier and a feedforward correction loop coupled to the output signal comparator and to the output port of the RF power amplifier as described above with respect to FIG. 2. The feedforward correction loop preferably includes a feedforward comparator coupled to a feedforward signal coupler, to a feedforward quadrature modulator, and to an error amplifier. The transmitter, preferably the feedforward quadrature modulator, modulates (1101) the input signal sourced by the information source to produce a quadrature modulated input signal. Preferably, the frequency of the quadrature modulated input signal is approximately the frequency of the output signal. The feedforward quadrature modulator conveys the quadrature modulated input signal to the feedforward comparator. The feedforward signal coupler samples (1102) the output signal to produce a feedforward attenuated output signal and conveys the feedforward attenuated output signal to the feedforward comparator. The feedforward comparator compares (1103) the quadrature modulated input signal and the feedforward attenuated output signal and determines (1104) an error signal based on a difference between the quadrature modulated input signal and the attenuated output signal. The feedforward comparator conveys the error signal to the error amplifier, and the error amplifier amplifies (1105) the error signal to produce an amplified error signal and conveys the amplified error signal to the output signal comparator. The output signal comparator compares (1106) the amplified error signal and the corrected output signal and determines (1107) a further corrected output signal based on a difference between the two signals, and the logic flow ends (1009).

In general, in the alternate embodiment of the present invention as described in FIG. 11, the method of correcting distortion in a transmitter further includes comparing the signal output by the RF power amplifier to a modulated version of the input signal and determining an error signal based on the comparison. The error signal is then used to correct distortion that failed to be canceled in the RF power amplifier by the use of the predistorted input signal.

In sum, the present invention provides for correction of distortion introduced by an RF power amplifier by generating a predistorted input signal that includes compensation for the distortion and by using a feedforward correction loop that provides compensation for residual distortion not corrected by the predistorted input signal. By reducing the amount of error in the output signal by use of a predistorted input signal, the error signal is reduced in power, thereby reducing the size and cost of the required error amplifier (i.e., error amplifier 262). The predistorted input signal is generated by a predistortion signal loop and is based on a performance characterization of the RF power amplifier by the predistortion signal loop. Since the predistorted input signal is produced at baseband and does not require a predistortion modulator required in the prior art, the present invention is less costly to produce, less complex, and more precise than the prior art's predistortion feedback loop, which operates at RF. Additionally the present invention includes the magnitude and phase alignment components required at the feedforward loop signal summing junction (i.e., combiner 258) at baseband. This further reduces the cost and size associated with the feedforward loop.

While the present invention has been particularly shown and described with reference to particular embodiments thereof, it will be understood by those skilled in the art that various changes in form and details may be made therein without departing from the spirit and scope of the present invention.

We claim:

1. In a transmitter that comprises a radio frequency (RF) power amplifier that comprises an input port and an output port, wherein the transmitter receives an input signal from an information source, wherein the input signal comprises a plurality of signal components, wherein the RF power amplifier amplifies a predistorted input signal to produce an output signal, and wherein the output signal comprises a plurality of signal components, an apparatus for correcting distortion in the transmitter comprising:

a quadrature demodulator that is capable of receiving at least a portion of the output signal and that demodulates the at least a portion of the output signal to produce a plurality of baseband output signal components;

a predistortion vector amplitude generator coupled to the quadrature demodulator that receives at least a portion of the input signal wherein the at least a portion of the input signal comprises a plurality of input signal components, receives at least one baseband output signal component of the plurality of baseband output signal components, and determines a RF power amplifier characterization function based on the at least one baseband output signal component and at least one input signal component of the plurality of input signal components, wherein the RF power amplifier characterization function comprises a plurality of function coefficients;

a vector amplitude source coupled to the predistortion vector amplitude generator that receives and stores the plurality of function coefficients; and a predistorted input signal generator coupled to the vector amplitude source that produces a predistorted input signal based on the plurality of function coefficients, wherein the predistorted input signal is capable of correcting distortion in the transmitter.

2. The apparatus of claim 1, wherein the input signal comprises a quadrature modulation signal that comprises an in-phase component and a quadrature component, wherein the plurality of baseband output signal components comprises an in-phase baseband output signal component and a quadrature baseband output signal component, wherein the radio frequency (RF) power amplifier characterization function comprises an in-phase component amplitude function and a quadrature component amplitude function, and wherein the predistortion vector amplitude generator comprises:

a first magnitude scaler that receives the in-phase component and the quadrature component of the input signal and magnitude scales each component to produce a normalized in-phase component of the input signal and a normalized quadrature component of the input signal;

a second magnitude scaler that receives the in-phase baseband output signal component and the quadrature baseband output signal component and scales the magnitude of each baseband output signal component to produce a normalized in-phase baseband output signal component and a normalized quadrature baseband output signal component;

a first cartesian-to-polar converter coupled to the first magnitude scaler that produces a normalized magnitude component and a normalized phase component of the input signal based on the normalized in-phase component of the input signal and a normalized quadrature component of the input signal;

a second cartesian-to-polar converter coupled to the second magnitude scaler that produces a normalized magnitude baseband output signal component and a normalized phase baseband output signal component based on the normalized in-phase baseband output signal component and a normalized quadrature baseband output signal component;

a phase inverter coupled to the second cartesian-to-polar converter that inverts the normalized phase baseband output signal component to produce an inverted phase component;

a summing junction coupled to the first cartesian-to-polar converter and to the phase inverter that compares the normalized phase component of the input signal to the inverted phase component and produces a modified normalized phase component of the input signal;

a polar-to-cartesian converter coupled to the summing junction and to the first cartesian-to-polar converter that produces an in-phase component and a quadrature component based on the normalized magnitude component of the input signal and the modified normalized phase component of the input signal;

a first curve generator coupled to the first polar-to-cartesian converter and to the second polar-to-cartesian converter that determines the in-phase component amplitude function based on the in-phase component produced by the polar-to-cartesian converter and on the normalized magnitude baseband output signal component, wherein the in-phase component amplitude function comprises a plurality of in-phase component amplitude function coefficients;

a second curve generator coupled to the first polar-to-cartesian converter and to the second polar-to-cartesian converter that determines the quadrature component amplitude function based on the quadrature component produced by the polar-to-cartesian converter and on the normalized magnitude baseband output signal component, wherein the quadrature amplitude function comprises a plurality of quadrature component amplitude function coefficients; and wherein the vector amplitude source receives and stores the plurality of in-phase component amplitude function coefficients and the plurality of quadrature component amplitude function coefficients.

3. The apparatus of claim 2, wherein the first curve generator further determines a predistorted signal in-phase component amplitude value based on the in-phase component amplitude function, wherein the predistorted signal in-phase component amplitude value is conveyed to the vector amplitude source and stored by the vector amplitude source, and wherein the predistorted input signal generator produces a predistorted input signal based on the predistorted signal in-phase component amplitude value.

4. The apparatus of claim 2, wherein the second curve generator further determines a predistorted signal quadrature component amplitude value based on the quadrature component amplitude function, wherein the predistorted signal quadrature component amplitude value is conveyed to the vector amplitude source and stored by the vector amplitude source, and wherein the predistorted input signal generator produces a predistorted input signal based on the predistorted signal quadrature component amplitude value.

5. The apparatus of claim 2, further comprising a signal coupler coupled to the output port of the radio frequency power amplifier and to the quadrature demodulator that samples the output signal to produce an attenuated output signal, wherein the attenuated output signal is conveyed by the signal coupler to the quadrature demodulator.

6. The apparatus of claim 2, wherein the summing junction comprises a first summing junction, and wherein the predistortion vector amplitude generator further comprises:

a magnitude inverter coupled to second cartesian-to-polar converter that receives at least a portion of the normalized magnitude baseband output signal component and inverts the at least a portion of the normalized magnitude baseband output signal component to produce an inverted magnitude component;

a second summing junction coupled between the polar-to-cartesian converter and the first curve generator and further coupled to the magnitude inverter, wherein the second summing junction receives the in-phase component produced by the polar-to-cartesian converter and the inverted magnitude component and combines the in-phase component and the inverted magnitude component to produce a modified in-phase component; and wherein the first curve generator determines the in-phase component amplitude function based on the modified in-phase component produced by the second summing junction and on the normalized magnitude baseband output signal component and wherein the predistorted input signal produces by the predistorted input signal generator comprises a predistortion component signal.

7. The apparatus of claim 6, further comprising a predistortion loop quadrature modulator coupled to the predistorted input signal generator that modulates the predistortion component signal to produce a modulated predistortion component signal.

8. The apparatus of claim 1, wherein the input signal comprises a quadrature modulation signal comprising an in-phase component and a quadrature component, and wherein the predistorted input signal generator comprises:

a first cartesian-to-polar converter that receives at least a portion of each of the in-phase component and the quadrature component of the input signal and produces an amplitude component and a phase component of the input signal based on the at least a portion of each of the in-phase component and a quadrature component;

an in-phase component generator coupled to the first cartesian-to-polar converter that receives the amplitude component of the input signal and determines a new in-phase component based on the amplitude component of the input signal and with reference to the vector amplitude source;

a quadrature component generator coupled to the first cartesian-to-polar converter that receives the amplitude component of the input signal and determines a new quadrature component based on the amplitude component of the input signal and with reference to the vector amplitude source;

a second cartesian-to-polar converter coupled to the in-phase component generator and to the quadrature component generator that receives the new in-phase component and the new quadrature component and produces a magnitude component and a phase component of a new input signal based on the new in-phase component produced by the in-phase component generator and the new quadrature component produced by the quadrature component generator;

a summer coupled to the first cartesian-to-polar converter and to the second cartesian-to-polar converter that receives the phase component of the input signal and the phase component produced by the second cartesian-to-polar converter and sums the two phase components to produce a predistorted input signal phase component; and a polar-to-cartesian converter coupled to the summer and to the second cartesian-to-polar converter that receives the magnitude component produced by the second cartesian-to-polar converter and the predistorted input signal phase component and produces an in-phase component and a quadrature component of a predistorted input signal based on the received magnitude component and predistorted input signal phase component.

9. The apparatus of claim 1, and wherein the apparatus further comprises:

an input quadrature modulator coupled to the input port of the radio frequency power amplifier and to the predistorted input signal generator;

a signal coupler coupled to the output port of the radio frequency (RF) power amplifier and to the quadrature demodulator that samples the output signal to produce an attenuated out signal, wherein the attenuated out signal is conveyed to the quadrature demodulator;

an output signal comparator coupled to the output port of the RF power amplifier; and a feedforward correction loop coupled to the output port of the RF power amplifier and to the output comparator, wherein the feedforward correction loop receives at least a portion of the input signal, samples the output signal to produce an attenuated output signal, produces a modulated input signal based on the at least a portion of the input signal, compares the attenuated output signal to the modulated input signal, and produces an error signal based on the comparison, wherein the error signal is used to correct distortion in the transmitter.

10. The apparatus of claim 9, wherein the input signal comprises a quadrature modulation signal that comprises an in-phase component and a quadrature component, and wherein the feedforward correction loop comprises:

a cartesian-to-polar converter that receives at least a portion of the input signal and produces an input signal magnitude component and an input signal phase component based on the at least a portion of the input signal;

a magnitude scaler coupled to the cartesian-to-polar converter that adjusts a magnitude of the input signal magnitude component;

a phase offset coupled to the cartesian-to-polar converter that introduces a phase offset to the input signal phase component;

a polar-to-cartesian converter coupled to the magnitude scaler and to the phase offset that receives the magnitude adjusted input signal magnitude component and the phase offset input signal phase component and produces an in-phase component and a quadrature component of a signal;

a feedforward loop signal coupler coupled to the output port of the radio frequency power amplifier that samples the output signal to produce an attenuated output signal;

a feedforward loop quadrature modulator coupled to the polar-to-cartesian converter that receives the in-phase component produced by the polar-to-cartesian converter and the quadrature component produced by the polar-to-cartesian converter and produces a quadrature modulated input signal;

a feedforward loop combiner coupled to the feedforward loop signal coupler and to the feedforward loop quadrature modulator that receives the attenuated output signal and the quadrature modulated input signal, combines the attenuated output signal and the modulated input signal, and produces an error signal based on the combination;

a vector modulator coupled to the feedforward loop combiner that receives the error signal and adjusts the phase and magnitude of the error signal; and an error amplifier coupled to the vector modulator and to the output comparator that receives and amplifies the phase and magnitude adjusted error signal to produce an amplified error signal, which amplified error signal is conveyed to the output comparator.

11. A transmitter that is capable of receiving an input signal from an information source and that produces an output signal based on the received input signal, wherein the transmitter comprises:

a predistortion signal loop comprising:
a predistortion loop signal coupler that samples the output signal to produce an attenuated output signal;

a quadrature demodulator coupled to the predistortion loop signal coupler that receives the attenuated output signal and demodulates the attenuated output signal to produce a plurality of baseband output signal components;

a predistortion vector amplitude generator coupled to the quadrature demodulator that receives at least a portion of the input signal wherein the at least a portion of the input signal comprises a plurality of input signal components, receives at least one baseband output signal component of the plurality of baseband output signal components, and determines a RF power amplifier characterization function based on the at least one baseband output signal component and at least one input signal component of the plurality of input signal components, wherein the RF power amplifier characterization function comprises a plurality of function coefficients;

a vector amplitude source coupled to the predistortion vector amplitude generator that receives and stores the plurality of function coefficients;

a predistorted input signal generator coupled to the vector amplitude source that produces a predistorted input signal based on the plurality of function coefficients, wherein the predistorted input signal is capable of correcting distortion in the transmitter;

an input quadrature modulator coupled to the predistortion signal loop that modulates the predistorted input signal to a desired output signal frequency to produce a modulated predistorted input signal; and a radio frequency power amplifier comprising an input port and an output port, wherein the input port is coupled to the input quadrature modulator, wherein the output port is coupled to the predistortion signal loop, and wherein the radio frequency power amplifier amplifies the modulated predistorted input signal to produce an output signal.

12. The transmitter of claim 11, wherein the RF power amplifier characterization function comprises an in-phase component amplitude function, wherein the predistortion vector amplitude generator further determines a predistorted signal in-phase component amplitude value based on the in-phase component amplitude function, wherein the predistorted signal in-phase component amplitude value is conveyed to the vector amplitude source and stored by the vector amplitude source, and wherein the predistorted input signal generator produces a predistorted input signal based on the predistorted signal in-phase component amplitude value.

13. The transmitter of claim 11, wherein the RF power amplifier characterization function comprises a quadrature component amplitude function, wherein the predistortion vector amplitude generator further determines a predistorted signal quadrature component amplitude value based on the quadrature component amplitude function, wherein the predistorted signal quadrature component amplitude value is conveyed to the vector amplitude source and stored by the vector amplitude source, and wherein the predistorted input signal generator produces a predistorted input signal based on the predistorted signal quadrature component amplitude value.

14. The transmitter of claim 11, further comprising:

an output comparator coupled to the output port of the radio frequency power amplifier; and a feedforward correction loop coupled to the output port of the RF power amplifier and to the output comparator, wherein the feedforward correction loop receives at least a portion of the input signal, samples the output signal to produce an attenuated output signal, produces a modulated input signal based on the at least a portion of the input signal, compares the attenuated output signal to the modulated input signal, and produces an error signal based on the comparison, wherein the error signal is used to correct distortion in the transmitter.

15. The transmitter of claim 11, further comprising:

an input signal combiner coupled between the input quadrature modulator and the input port of the radio frequency power amplifier and between the input quadrature modulator and the predistortion feedback loop;

a predistortion loop quadrature modulator coupled to the predistorted input signal generator; and wherein the predistorted input signal produced by the predistorted input signal generator comprises a predistortion component signal, wherein the predistortion loop quadrature modulator modulates the predistorted component signal to produce a modulated predistortion component signal that is conveyed to the input signal combiner, wherein the input quadrature modulator produces a modulated input signal based on the input signal received from the information source and conveys the modulated input signal to the input signal combiner, wherein the input signal combiner combines the modulated input signal and the modulated predistortion component signal and conveys the combined modulated input signal and modulated predistortion component signal to the radio frequency power amplifier, and wherein the radio frequency power amplifier amplifies the combined modulated input signal and modulated predistortion component signal to produce an output signal.

16. The transmitter of claim 15, further comprising:

a magnitude adjuster that receives an input signal from an information source and adjusts a magnitude of the input signal to produce a magnitude adjusted input signal;

a phase adjuster coupled to the magnitude adjuster and to the input quadrature modulator that receives the magnitude adjusted input signal, adjusts a phase of the magnitude adjusted input signal to produce a phase and magnitude adjusted input signal, and conveys the phase and magnitude adjusted input signal to the input quadrature modulator; and wherein the input quadrature modulator modulates the phase and magnitude adjusted input signal to produce a modulated input signal and wherein the magnitude adjustment of the input signal and the phase adjustment of the magnitude adjusted input signal are each based on the magnitude and phase of the modulated predistortion component signal at the input signal combiner.

17. The transmitter of claim 16, further comprising a feedforward correction loop coupled to the input quadrature modulator, to the output port of the RF power amplifier, and to the output comparator, wherein the feedforward correction loop receives at least a portion of the modulated input signal, samples the output signal to produce an attenuated output signal, compares the attenuated output signal to the at least a portion of the modulated input signal, and produces an error signal based on the comparison, wherein the error signal is used to correct distortion in the transmitter.

18. In a transmitter that comprises a radio frequency power amplifier, wherein distortion is introduced into the transmitter by the radio frequency power amplifier when the radio frequency power amplifier amplifies a signal input into the radio frequency power amplifier to produce an output signal, a method for correcting the distortion comprising the steps of:

sampling the output signal to produce an attenuated output signal;

receiving an input signal from an information source, wherein the input signal comprises a plurality of input signal components;

demodulating the attenuated output signal to produce a plurality of demodulated output signal components;

comparing at least one demodulated output signal component of the plurality of demodulated output signal components and at least one input signal component of the plurality of input signal components;

determining a radio frequency power amplifier characterization function based on the comparison of the at least one demodulated output signal component and the at least input signal component; and determining a predistorted input signal, based on the radio frequency power amplifier characterization function, to correct the distortion in the transmitter.

19. The method of claim 18, further comprising the step of amplifying the predistorted input signal to produce a corrected output signal.

20. The method of claim 19, further comprising the steps of:

modulating an input signal to produce a quadrature modulated input signal;

sampling an output signal to produce a feedforward attenuated output signal;

comparing the quadrature modulated input signal and the feedforward attenuated output signal;

determining an error signal based on a difference between the quadrature modulated input signal and the feedforward attenuated output signal;

amplifying the error signal to produce an amplified error signal;

comparing the error signal and the corrected output signal; and determining a further corrected error signal based on the comparison of the error signal and the corrected output signal.

* * * * *